(12) United States Patent
Kim et al.

(10) Patent No.: US 11,574,871 B2
(45) Date of Patent: Feb. 7, 2023

(54) SEMICONDUCTOR DEVICE

(71) Applicant: Samsung Electronics Co., Ltd., Suwon-si (KR)

(72) Inventors: Jun-Kwan Kim, Seoul (KR); Jae-Wha Park, Yongin-si (KR); Sang-Hoon Ahn, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 8 days.

(21) Appl. No.: 17/228,861

(22) Filed: Apr. 13, 2021

(65) Prior Publication Data

US 2021/0233862 A1   Jul. 29, 2021

Related U.S. Application Data

(63) Continuation of application No. 16/285,735, filed on Feb. 26, 2019, now Pat. No. 11,011,469.

(30) Foreign Application Priority Data

Jul. 24, 2018  (KR) .................. 10-2018-0085690

(51) Int. Cl.
*H01L 23/532* (2006.01)
*H01L 23/522* (2006.01)
(Continued)

(52) U.S. Cl.
CPC .... *H01L 23/53295* (2013.01); *H01L 21/0217* (2013.01); *H01L 21/02164* (2013.01);
(Continued)

(58) Field of Classification Search
CPC ......... H01L 23/53295; H01L 21/02164; H01L 21/02167
See application file for complete search history.

(56) References Cited

U.S. PATENT DOCUMENTS

| 6,162,583 A | 12/2000 | Yang et al. |
| 6,730,594 B2 | 5/2004 | Noguchi et al. |
| (Continued) | | |

FOREIGN PATENT DOCUMENTS

| JP | 2003-332426 A | 11/2003 |
| JP | 2015-207671 A | 11/2015 |
| (Continued) | | |

OTHER PUBLICATIONS

Examination Report dated Jul. 30, 2020 in Indian Application No. 201924007898.

(Continued)

*Primary Examiner* — Douglas M Menz
(74) *Attorney, Agent, or Firm* — Harness, Dickey & Pierce, P.L.C.

(57) ABSTRACT

A semiconductor may include a first inter metal dielectric (IMD) layer, a first blocking layer on the first IMD layer, a metal wiring and a second blocking layer. The first inter metal dielectric (IMD) layer may be formed on a substrate, the first IMD layer may include a low-k material having a dielectric constant lower than a dielectric constant of silicon oxide. The first blocking layer may be formed on the first IMD layer. The first blocking layer may include an oxide having a dielectric constant higher than the dielectric constant of the first IMD layer. The metal wiring may be through the first IMD layer and the first blocking layer. The second blocking layer may be formed on the metal wiring and the first blocking layer. The second blocking layer may include a nitride. The first and second blocking layers may reduce or prevent from the out gassing, so that a semiconductor device may have good characteristics.

20 Claims, 16 Drawing Sheets

(51) Int. Cl.
*H01L 21/768* (2006.01)
*H01L 21/8234* (2006.01)
*H01L 21/02* (2006.01)
*H01L 21/311* (2006.01)
*H01L 21/288* (2006.01)
*H01L 21/321* (2006.01)
*H01L 23/528* (2006.01)
*C23C 16/36* (2006.01)
*C23C 16/50* (2006.01)
*C23C 16/40* (2006.01)

(52) U.S. Cl.
CPC .. *H01L 21/02167* (2013.01); *H01L 21/02208* (2013.01); *H01L 21/02274* (2013.01); *H01L 21/2885* (2013.01); *H01L 21/31116* (2013.01); *H01L 21/31144* (2013.01); *H01L 21/3212* (2013.01); *H01L 21/7684* (2013.01); *H01L 21/76802* (2013.01); *H01L 21/76834* (2013.01); *H01L 21/76843* (2013.01); *H01L 21/76877* (2013.01); *H01L 21/823475* (2013.01); *H01L 23/5226* (2013.01); *H01L 23/5283* (2013.01); *H01L 23/53238* (2013.01); *C23C 16/36* (2013.01); *C23C 16/401* (2013.01); *C23C 16/50* (2013.01); *H01L 21/0228* (2013.01); *H01L 21/76873* (2013.01); *H01L 23/53214* (2013.01)

(56) References Cited

U.S. PATENT DOCUMENTS

| | | |
|---|---|---|
| 6,744,090 B2 | 6/2004 | Kim |
| 6,838,772 B2 | 1/2005 | Saitoh et al. |
| 7,102,232 B2 | 9/2006 | Clevenger et al. |
| 7,422,979 B2 | 9/2008 | Michaelson et al. |
| 7,432,151 B2 | 10/2008 | Kim |
| 8,927,442 B1 | 1/2015 | Angyal et al. |
| 9,643,838 B1 | 5/2017 | Chu et al. |
| 2010/0025851 A1 | 2/2010 | Lee |
| 2013/0175693 A1 | 7/2013 | Kim et al. |
| 2017/0338192 A1 | 11/2017 | Lee et al. |
| 2018/0033723 A1 | 2/2018 | Landgraf et al. |

FOREIGN PATENT DOCUMENTS

| | | |
|---|---|---|
| KR | 10-2003-0089474 A | 11/2003 |
| KR | 10-0422597 B1 | 3/2004 |
| KR | 10-2013-0081073 A | 7/2013 |
| KR | 10-2017-0125177 A | 11/2017 |

OTHER PUBLICATIONS

Non-Final Office Action dated Sep. 2, 2020 in U.S. Appl. No. 16/285,735.
Notice of Allowance dated Jan. 11, 2021 in U.S. Appl. No. 16/285,735.
The first Written Opinion and Search Report dated Aug. 4, 2022 in Singaporean Application No. 10201903225W.
Office Action dated Nov. 30, 2022 in Korean Application No. 10-2018-0085690.

SEMICONDUCTOR DEVICE

CROSS-REFERENCE TO RELATED APPLICATIONS

This application is a Continuation of U.S. application Ser. No. 16/285,735, filed on Feb. 26, 2019, which claims priority under 35 USC § 119 to Korean Patent Application No. 10-2018-0085690, filed on Jul. 24, 2018 in the Korean Intellectual Property Office (KIPO), the contents of which are herein incorporated by reference in their entirety.

BACKGROUND

1. Field

Example embodiments relate to a semiconductor device. More particularly, example embodiments relate to a semiconductor device including wiring structures.

2. Description of the Related Art

In a semiconductor device, an insulating interlayer between metal wirings may be formed as a low-k dielectric layer to reduce the parasitic capacitance. Some materials included in the low-k dielectric layer may be outgassed during a high-temperature process, and thus failures of the semiconductor device may occur due to the outgassing.

SUMMARY

Example embodiments provide a semiconductor device having improved characteristics.

According to example embodiments, there is provided a semiconductor device. The semiconductor may include a first inter metal dielectric (IMD) layer, a first blocking layer on the first IMD layer, a metal wiring and a second blocking layer. The first inter metal dielectric (IMD) layer may be formed on a substrate, the first IMD layer may include a low-k material having a dielectric constant lower than a dielectric constant of silicon oxide. The first blocking layer may be formed on the first IMD layer. The first blocking layer may include an oxide having a dielectric constant higher than the dielectric constant of the first IMD layer. The metal wiring may be through the first IMD layer and the first blocking layer. The second blocking layer may be formed on the metal wiring and the first blocking layer. The second blocking layer may include a nitride.

According to example embodiments, there is provided a semiconductor device. The semiconductor may include a lower wiring structure, a first inter metal dielectric (IMD) layer, a metal wiring, a blocking layer structure, a second IMD layer and a via contact. The lower wiring structure may include a lower inter metal dielectric (IMD) layer and a lower metal wiring through the lower IMD layer on a substrate. The lower IMD layer may include a low-k material having a dielectric constant lower than a dielectric constant of silicon oxide. The lower metal wiring may include a metal. The first IMD layer may be formed on the lower wiring structure. The first IMD layer may include a low-k material having a dielectric constant lower than a dielectric constant of silicon oxide. The metal wiring may be through the first IMD layer. The blocking layer structure may be formed on the first IMD layer and the metal wiring. The blocking layer structure may include a first blocking layer and a second blocking layer. The first blocking layer may include a material having a dielectric constant higher than the dielectric constant of the first IMD layer, and the second blocking layer may include a material having a dielectric constant higher than the dielectric constant of the first blocking layer. The second IMD layer may be formed on the second blocking layer. The second IMD layer may include a material having a dielectric constant higher than the dielectric constant of the first IMD layer. The via contact on the metal wiring may be through the second IMD layer and the second blocking layer.

According to example embodiments, there is provided a semiconductor device. The semiconductor may include a lower wiring structure, a first inter metal dielectric (IMD) layer, a metal wiring, a blocking layer structure, a second IMD layer, a via contact, an upper metal pattern and an upper insulating interlayer. The lower structure may include a transistor on a substrate. The first IMD layer may be formed on the lower structure. The first IMD layer may include a low-k material having a dielectric constant lower than a dielectric constant of silicon oxide. The metal wiring may be through the first IMD layer. The blocking layer structure may be formed on the first IMD layer and the metal wiring. The blocking layer structure may include a first blocking layer and a second blocking layer. The first blocking layer may include a material having a dielectric constant higher than the dielectric constant of the first IMD layer, and the second blocking layer may include a material having a dielectric constant higher than the dielectric constant of the first blocking layer. The second IMD layer may be formed on the blocking layer structure. The via contact may be formed on the metal wiring through the second IMD layer and the second blocking layer. The upper metal pattern may be formed on the via contact. The upper insulating interlayer may cover the upper metal pattern.

In the semiconductor device in example embodiments, outgassing of materials included in the low-k dielectric layer may be decreased by the first and second blocking layers. Thus, the semiconductor device may have good characteristics.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with example embodiments;

FIGS. 2 to 10 are cross-sectional views illustrating stages of a method of manufacturing a semiconductor device in accordance with example embodiments;

FIG. 11 is a cross-sectional view illustrating a semiconductor device in accordance with example embodiments;

FIGS. 12 to 17 are cross-sectional views illustrating stages of a method of manufacturing a semiconductor device in accordance with example embodiments;

FIG. 18 is a cross-sectional view illustrating a semiconductor device in accordance with example embodiments;

FIG. 19 is a cross-sectional view illustrating a semiconductor device in accordance with example embodiments;

FIG. 20 is a cross-sectional view illustrating a semiconductor device in accordance with example embodiments; and FIG. 21 is a cross-sectional view illustrating a semiconductor device in accordance with example embodiments.

DESCRIPTION OF EMBODIMENTS

Figure 1:
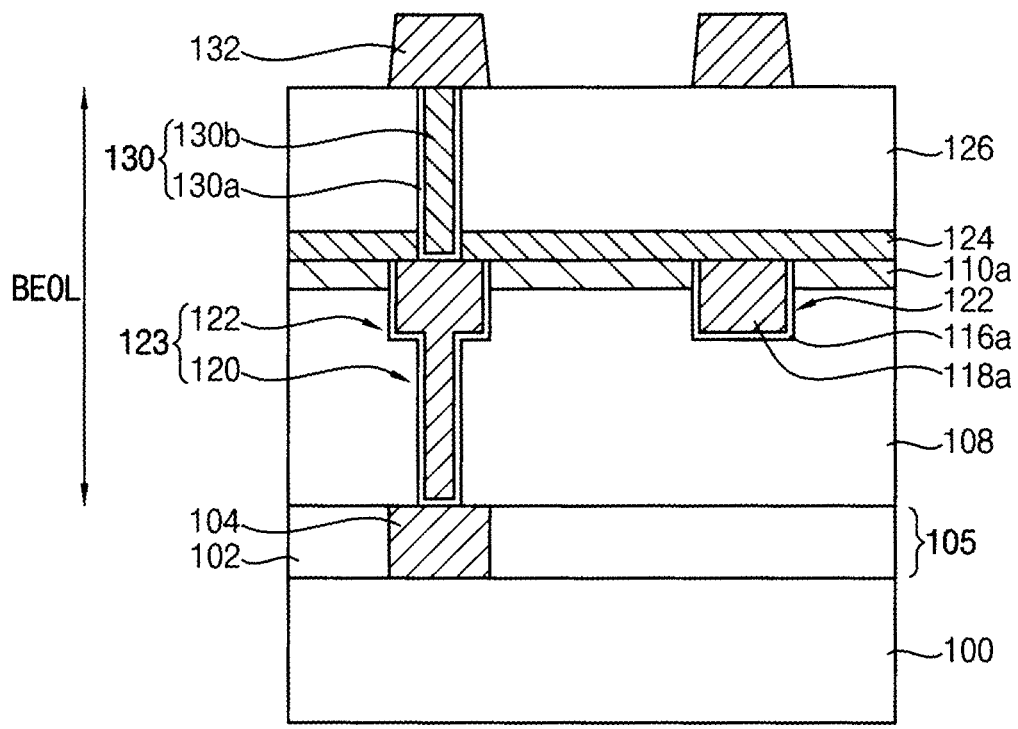
FIGS. 1 to 21 represent non-limiting, example embodiments as described herein.

FIG. 1 is a cross-sectional view illustrating a semiconductor device in accordance with example embodiments.

Referring to FIG. 1, the semiconductor device may include a lower structure 105 formed on a substrate 100, and a first inter metal dielectric (IMD) layer 108, first wirings 123, a first blocking layer 110a, a second blocking layer 124, a second inter metal dielectric (IMD) layer 126, a via contact 130 and/or second wirings 132 formed on the lower structure 105.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

The lower structure 105 may include, e.g., a transistor, a capacitor, a resistor, a lower wiring 104, a lower insulating interlayer 102, etc.

A wiring structure of a BEOL (back end of line) may be formed on the lower structure 105.

The first IMD layer 108 may be formed on the lower structure 105, and may include a low-k material having a dielectric constant lower than a dielectric constant of silicon oxide (SiO2). For example, the silicon oxide may have the dielectric constant of about 3.9 to about 4.5. The first IMD layer 108 may have the dielectric constant of 3.5 or less. For example, the first IMD layer 108 may have the dielectric constant of about 2.0 to about 3.5. In example embodiments, the first IMD layer 108 may include silicon oxide including carbon and hydrogen (SiCOH). For example, the first IMD layer 108 may include carbon of about 10% to about 50%. In some example embodiments, the first IMD layer 108 may include silicon oxide doped with fluorine (F—SiO$_2$), a porous silicon oxide, etc.

In example embodiments, a lower insulation layer (not shown) may be further formed between the lower structure 105 and the first IMD layer 108. The lower insulation layer may include, e.g., silicon oxide, silicon nitride or SiCN.

The first blocking layer 110a may be formed on the first IMD layer 108. The first blocking layer 110a may include an oxide having a dielectric constant higher than the dielectric constant of the first IMD layer 108. In example embodiments, the first blocking layer 110a may include silicon oxide having a dielectric constant of about 3.9 to about 4.5. For example, the first blocking layer 110a may include a TEOS layer, which may be silicon oxide formed using TEOS (Tetraethyl orthosilicate) as a source.

The first blocking layer 110a may have a density and a strength higher than a density and a strength of the first IMD layer 108. Thus, the first blocking layer 110a may reduce or prevent outgassing from the first IMD layer 108 or gas entering into the first IMD layer 108. That is, the first blocking layer 110a may reduce or prevent outgassing of gases such as hydrogen (H2), water vapor (H2O), fluorine, chlorine, etc. from the first IMD layer. The first blocking layer 110a may reduce or prevent hydrogen or water vapor from entering into the first IMD layer 108.

In addition, the first blocking layer 110a may serve as an adhesion layer between the first IMD layer 108 and the second blocking layer 124. Thus, the first IMD layer 108 and the second blocking layer 124 may be more easily bonded by the first blocking layer 110a.

In example embodiments, the first blocking layer 110a may not include carbon (C). A carbon-containing layer may have a dielectric constant lower than a dielectric constant of silicon nitride (SiN), and the carbon-containing layer may have carbon content higher than carbon content of the silicon nitride. The carbon-containing layer may have a density lower than a density of the silicon nitride, and thus outgassed materials from the first IMD layer 108 may easily pass through the carbon-containing layer. For example, the carbon-containing layer, e.g., SiCN and SiCO may not block outgassing of hydrogen from the first IMD layer 108, so that the SiCN and SiCO may not be suitable for the first blocking layer 110a.

The first wiring 123 may contact a portion of the lower structure 105 through the first IMD layer 108 and the first blocking layer 110a.

In example embodiments, the first wiring 123 may include a contact plug 120 and a conductive line 122. The contact plug 120 may contact the portion of the lower structure 105, and the conductive line 122 may be formed on the contact plug 120 to extend in one direction. In some example embodiments, a plurality of the contact plugs 120 may be formed, and the conductive lines 122 may contact the contact plugs to extend in one direction parallel to the upper surface of the substrate 100.

The contact plug 120 and the conductive line 122 may include a first metal having a first resistance. In example embodiments, the first metal may include copper (Cu). For example, the contact plug 120 and the conductive line 122 may include a first barrier pattern 116a and a metal pattern 118a. The first barrier pattern 116a may be formed on a surface of the metal pattern 118a, and may include, e.g., titanium, titanium nitride, tantalum, and tantalum nitride, etc.

As described above, the first IMD layer 108 including the low-k material may be formed between the first wirings 123 including the first metal. Thus, the parasitic capacitance between the first wirings 123 may decrease.

In example embodiments, upper surfaces of the first wiring 123 and the first blocking layer 110a may be coplanar with each other. This, the blocking layer 110a may be formed on an upper sidewall of the first wiring 123. The first blocking layer 110a may contact an upper sidewall of the conductive line 122.

As the first wiring 123 is formed through the first IMD layer 108 and the first blocking layer 110a, a height of the first wiring 123 may be equal to a total thickness of the first IMD layer 108 and the first blocking layer 110a. When the thickness of first blocking layer 110a increases, a thickness of the first IMD 108 may relatively decrease, and thus a parasitic capacitance between the first wirings 123 may increase. In example embodiments, the first IMD layer 108 may have the thickness greater than the thickness of the first blocking layer 110a. For example, the thickness of the first blocking layer 110a may be less than 20% of the total thickness of the first IMD layer 108 and the first blocking layer 110a. In some example embodiments, the thickness of the first blocking layer 110a may be greater than about 100A to block the outgassing from the first IMD layer 108.

The second blocking layer 124 may cover upper surfaces of the first wiring 123 and the first blocking layer 110a.

The second blocking layer 124 may serve as a main blocking layer to reduce or prevent the outgassing of gases such as hydrogen (H2), water vapor (H2O), fluorine, chlorine, etc. from the first IMD layer 108. That is, the second blocking layer 124 may be better in blocking outgas sing of hydrogen or water vapor than the first blocking layer 110a. In addition, the second blocking layer 124 may serve as a diffusion barrier layer of the first wiring 123 and an etch stop layer.

The second blocking layer 124 may include a nitride having a dielectric constant higher than the dielectric constant of the first blocking layer 110a. For example, the second blocking layer 124 may include a material having a dielectric constant of 6 or more. For example, the second blocking layer 124 may include silicon nitride (SiN).

In example embodiments, the second blocking layer 124 may not include carbon (C). As a carbon-containing layer has a density lower than a density of a silicon nitride layer, so that outgassed materials from the first IMD layer 108 may pass through the carbon-containing layer. Thus, a carbon-containing layer may not be suitable for the second blocking layer 124.

In example embodiments, the second IMD layer 126 may be an insulating interlayer between via contacts 130 formed at a top portion of wiring structure of a BEOL. The second IMD layer 126 may have a dielectric constant higher than the dielectric constants of other IMD layers below the second IMD layer 126. The second IMD layer 126 may have the dielectric constant lower than the dielectric constant of the second blocking layer 124.

That is, the second IMD layer 126 may include an oxide having the dielectric constant higher than the dielectric constant of the first IMD layer 108. In example embodiments, the second IMD layer 126 may include silicon oxide having a dielectric constant of about 3.9 to about 4.5. For example, the second IMD layer 126 may include a TEOS layer, which may be silicon oxide formed using TEOS as a source. Thus, the second IMD layer 126 may have an etching resistance, a density and a bonding strength higher than those of the first IMD 108, respectively.

The via contact 130 may contact an upper surface of the first wiring 123 through the second IMD layer 126 and the second blocking layer 124.

The via contact 130 may be a contact plug formed at the top portion of the wiring structure of the BEOL. The via contact 130 may include a second metal different from the first metal. The second metal may have a second resistance higher than the first resistance. The second metal may include a material which may be deposited at a higher temperature than a temperature of depositing the first metal. For example, the second metal may include a material which may be deposited at a temperature greater than about 300° C. The second metal may include, e.g., tungsten.

In example embodiments, the via contact 130 may include a second barrier layer 130a and a metal plug 130b. For example, the metal plug 130b may include tungsten, and the second barrier layer 130a may include tungsten nitride.

The second wiring 132 may be formed on the via contact 130 and the second IMD layer 126. The second wiring 132 may contact an upper surface of the via contact 130 to extend in one direction. The second wiring 132 may be positioned at the top portion of the wiring structure of the BEOL.

In example embodiments, the second wiring 132 may include a third metal having a third resistance lower than the second resistance. As the second wiring 132 may be positioned at the top portion of the wiring structure of the BEOL, for example, the second wiring 132 may include a metal whose corrosion due to oxidation can be reduced.

For example, the third metal may include aluminum. In some example embodiments, when a surface of the aluminum is oxidized to form aluminum oxide, the aluminum oxide may serve as an oxidation film (e.g., protection layer) of an underlying aluminum. However, other materials, for example, such as copper may be easily and excessively oxidized, and thus the copper may not be suitable as a material of the second wiring 132.

An upper insulating interlayer (not shown) may be formed to cover the second wiring 132. The upper insulating inter-layer may include e.g., silicon oxide. In example embodiments, the upper insulating interlayer may include silicon oxide including hydrogen.

In the semiconductor device, the first and second blocking layers 110a and 124 may be formed on a low-k dielectric layer formed at the top portion of the wiring structure of the BEOL, that is the first IMD layer 108. The first blocking layer 110a may be formed on an upper sidewall of a copper wiring formed at the top of the wiring structure of the BEOL, which may be the first wiring 123. The second blocking layer 124 may be formed on the first blocking layer 110a and an upper surface of the copper wiring. Thus, the first and second blocking layers 110a and 124 may reduce or prevent from outgas sing generated from the low-k dielectric layer.

FIGS. 2 to 10 are cross-sectional views illustrating stages of a method of manufacturing a semiconductor device in accordance with example embodiments.

Figure 2:
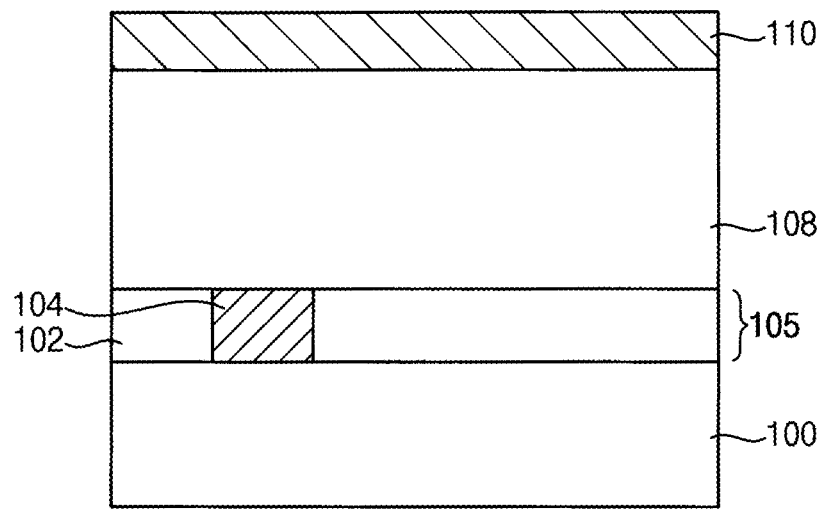

Referring to FIG. 2, lower structures 105 may be formed on a substrate 100. A first IMD layer 108 may be formed on the lower structures 105. A preliminary first blocking layer 110 may be formed on the first IMD layer 108.

The lower structure 105 may include, e.g., a transistor, a capacitor, a resistor, a lower wiring 104, a lower insulating interlayer 102, etc.

A lower insulating interlayer (not shown) may be formed on the lower structure 105. The lower insulating interlayer may include silicon oxide, silicon nitride, or SiCN.

The first IMD layer 108 may be formed by depositing a low-k material having a dielectric constant lower than a dielectric constant of silicon oxide (SiO2). In example embodiments, the first IMD layer 108 may be silicon oxide including carbon and hydrogen (SiCOH). For example, the first IMD layer 108 may include carbon of about 10% to about 50%. In some example embodiments, the first IMD layer 108 may include a fluorine-doped silicon oxide (F—SiO2) or a porous silicon oxide.

The preliminary first blocking layer 110 may be formed of an oxide having a dielectric constant higher than the dielectric constant of the first IMD layer 108. The preliminary first blocking layer 110 may be formed of silicon oxide having a dielectric constant of about 3.9 to about 4.5. The preliminary first blocking layer 110 may be formed to have a thickness greater than a target thickness of a first blocking layer. In example embodiments, the preliminary first blocking layer 110 may be formed by a chemical vapor deposition (CVD) process using TEOS as a deposition source. That is, the preliminary first blocking layer 110 may include a TEOS layer.

The preliminary first blocking layer 110 may reduce or prevent outgassing of gases such as hydrogen or water vapor from the first IMD layer or entering the gases into the first IMD layer 108. The preliminary first blocking layer 110 may not include carbon (C).

Figure 3:
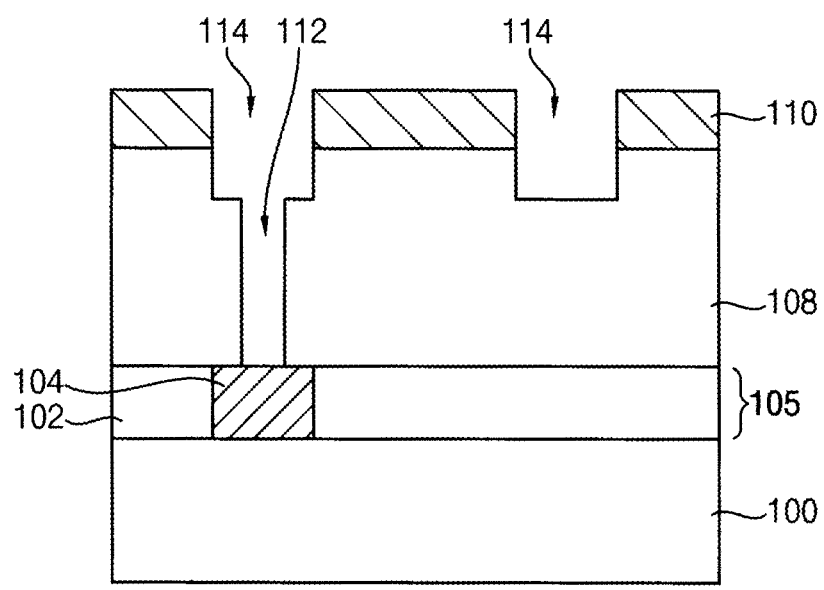

Referring to FIG. 3, a first etching mask (not shown) may be formed on the preliminary first blocking layer 110. The preliminary first blocking layer 110 and the first IMD layer 108 may be sequentially etched to form a first contact hole 112 extending through the preliminary first blocking layer 110 and the first IMD layer 108. In example embodiments, the first contact hole 112 may be formed to expose an upper surface of a conductive layer included in the lower structure 105, e.g., the lower wiring 104. Then, a sacrificial layer (not shown) may be formed to fill the first contact hole 112.

A second etching mask may be formed on the preliminary first blocking layer 110 and the sacrificial layer, and then the upper portions of the preliminary first blocking layer 110 and the first IMD layer 108 may be etched to form a first trench 114. The first trench 114 may extend in one direction parallel to an upper surface of the substrate 100. The first trench 114 and the first contact hole 112 may be in communication with each other. In example embodiments, plurality of the first contact holes 112 may be formed, and the first trench 114 may extend to be in communication with the first contact holes 112.

In example embodiments, orders of forming the first trench 114 and forming the first contact hole 112 may be reversed.

In example embodiments, during the etching process, gases used in the etching process such as fluorine or chlorine may be introduced into the first IMD layer 108.

Figure 4:
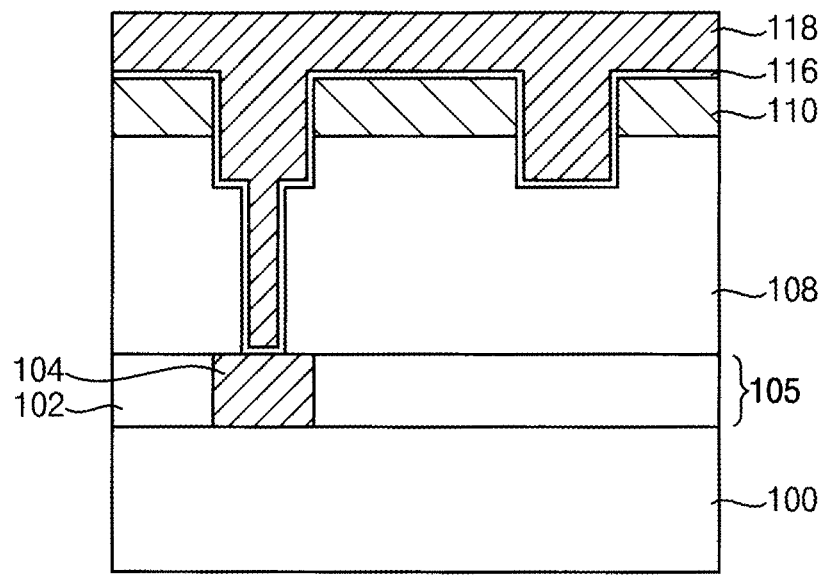

Referring to FIG. 4, a first barrier layer 116 may be conformally formed on the preliminary first blocking layer 110, the first trench 114, and a sidewall and a bottom of the first contact hole 112. A first metal layer 118 may be formed on the first barrier layer 116 to sufficiently fill the first trench 114 and the first contact hole 112.

The first barrier layer 116 may include, e.g., titanium, titanium nitride, tantalum, and tantalum nitride, etc. The first metal layer 118 may include a metal having a first resistance. The first metal layer 118 may be formed by performing a depositing process of a temperature lower than 300° C. For example, the first metal layer 118 may include copper. After forming a seed layer, the copper may be deposited by performing an electroplating process using the seed layer (not shown) as a seed. A heat treatment may be further performed after the electroplating process.

The first barrier layer 116 and the first metal layer 118 are formed at a temperature lower than 300° C., so that outgassing from the first IMD layer 108 may hardly occur during forming the first barrier layer 116 and the first metal layer 118. Thus, the first barrier layer 116 and the first metal layer 118 may have no void therein, and may sufficiently fill the first trench 114 and the first contact hole 112.

Figure 5:
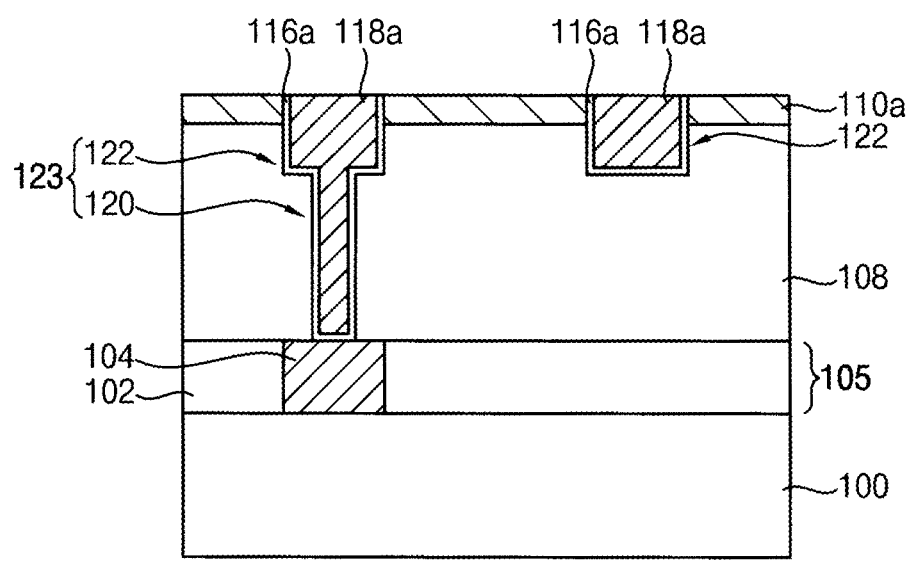

Referring to FIG. 5, the first metal layer 118 and the first barrier layer 116 may be planarized to form a first barrier pattern 116a and a metal pattern 118a. Thus, a first wiring 123 including the contact plugs 120 and the conductive lines 122 may be formed in the first contact holes 112 and the first trenches 114. The planarization process may be performed by a chemical mechanical polishing (CMP) process and/or an etch-back process.

An upper portion of the preliminary first blocking layer 110 may be removed by the planarization process, so that a first blocking layer 110a may be formed. After the planarization process, the upper surface of the first IMD layer 108 may not be exposed. Thus, the first blocking layer 110a may be formed on an upper sidewall of the first wiring 123. The upper surfaces of the first blocking layer 110a and the first wiring 123 may be coplanar with each other.

A thickness of the first blocking layer 110a may be less than 20% of a total thickness of the first IMD layer 108 and the first blocking layer 110a. In example embodiments, a thickness of the first blocking layer 110a may greater than about 100 Å to block outgassing of hydrogen from the first IMD layer 108. The first blocking layer 110a may be formed between the second blocking layer subsequently formed and the first IMD layer 108. Thus, the first blocking layer may serve as an adhesion layer between the second blocking layer and the first IMD layer 108.

Figure 6:
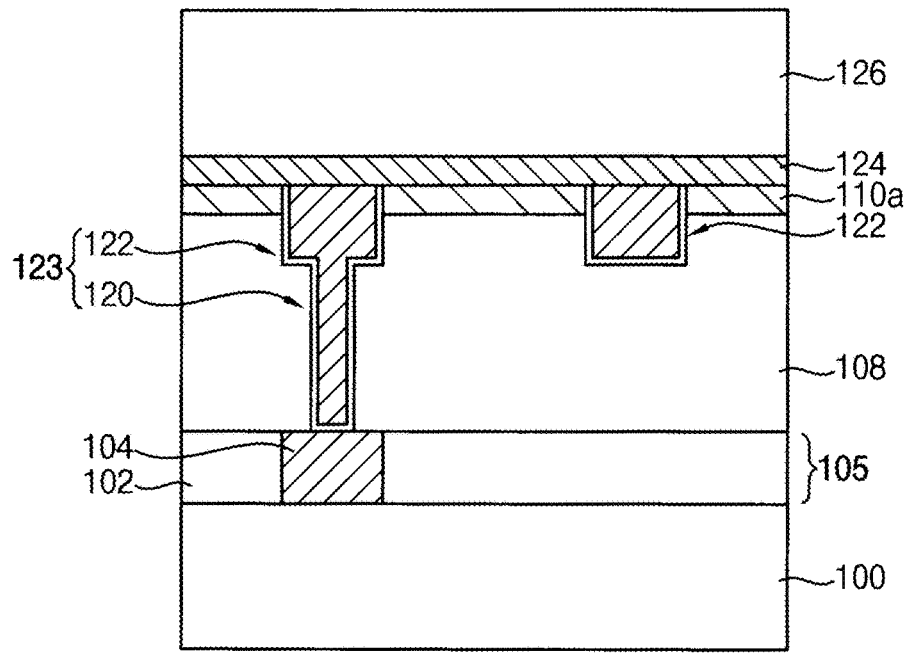

Referring to FIG. 6, a second blocking layer 124 may be formed on the first blocking layer 110a and the first wiring 123. A second IMD layer 126 may be formed on the second blocking layer 124.

The second blocking layer 124 may serve as a main blocking layer for reducing or preventing outgassing such as hydrogen or water vapor from the first IMD layer 108 or entering the gas into the first IMD layer 108. The second blocking layer 124 may be formed of silicon nitride having a dielectric constant higher than the dielectric constant of the first blocking layer 110a. However, the second blocking layer 124 may not include carbon (C).

The second IMD layer 126 may be formed of an oxide having the dielectric constant higher than the dielectric constant of the first IMD layer 108. In example embodiments, the second IMD layer 126 may be formed by depositing silicon oxide having a dielectric constant of about 3.9 to about 4.5. For example, the second IMD layer 126 may include a TEOS layer which may be formed by a CVD process using TEOS as a deposition source.

Figure 7:
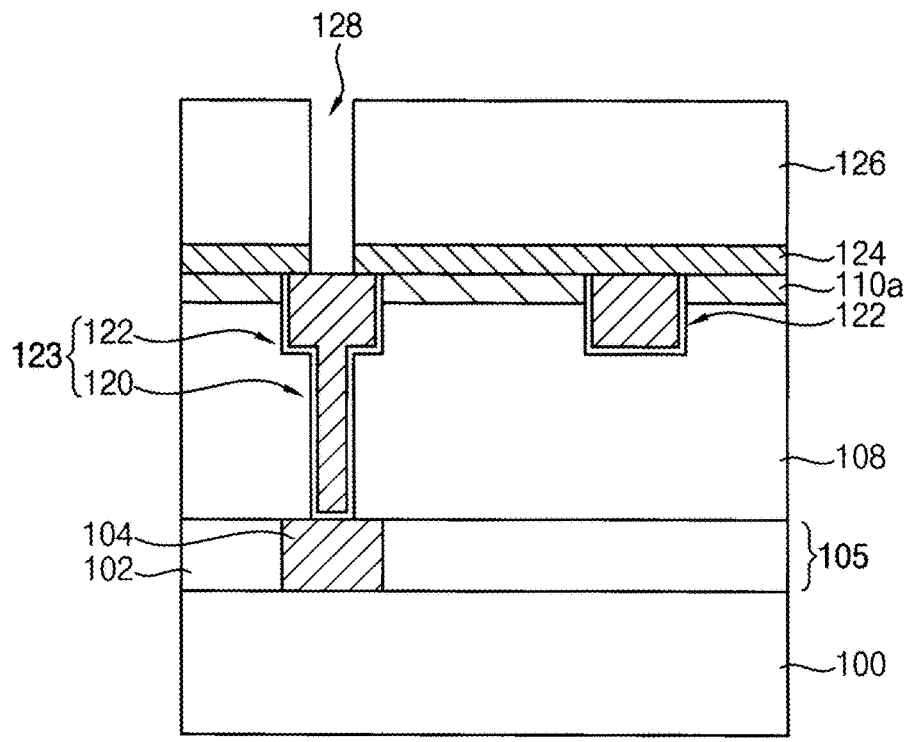
Figure 8:
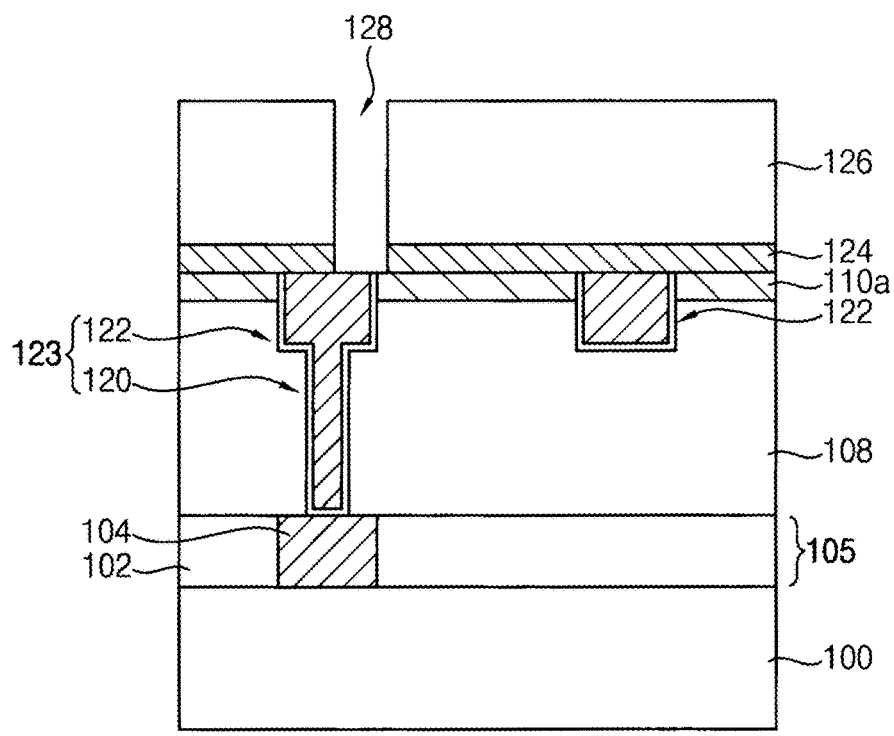

Referring to FIGS. 7 and 8, portions of the second IMD layer 126 and the second blocking layer 124 are sequentially etched to form a via hole 128 exposing an upper surface of the first wiring 123.

In example embodiments, as shown in FIG. 7, the second blocking layer 124 may be exposed by a lower sidewall of the via hole 128, and the upper surface of the first wiring 123 may be exposed by a bottom of the via hole 128.

In some example embodiments, as shown in FIG. 8, the via hole 128 may be misaligned, so that some portions of the via hole 128 may be deviated from the edge of the first wiring 123. In example embodiments, the second blocking layer 124 may be exposed by the lower sidewall of the via hole 128, and upper surfaces of the first blocking layer 110a and the first wiring 123 may be exposed by the bottom of the via hole 128.

However, the first IMD layer 108 may not be exposed by the via hole 128. In the subsequent process, the first and second blocking layers 110a and 124 may block outgassing the materials included in the first IMD layer 108, so that the materials may not be outgassed.

Figure 9:
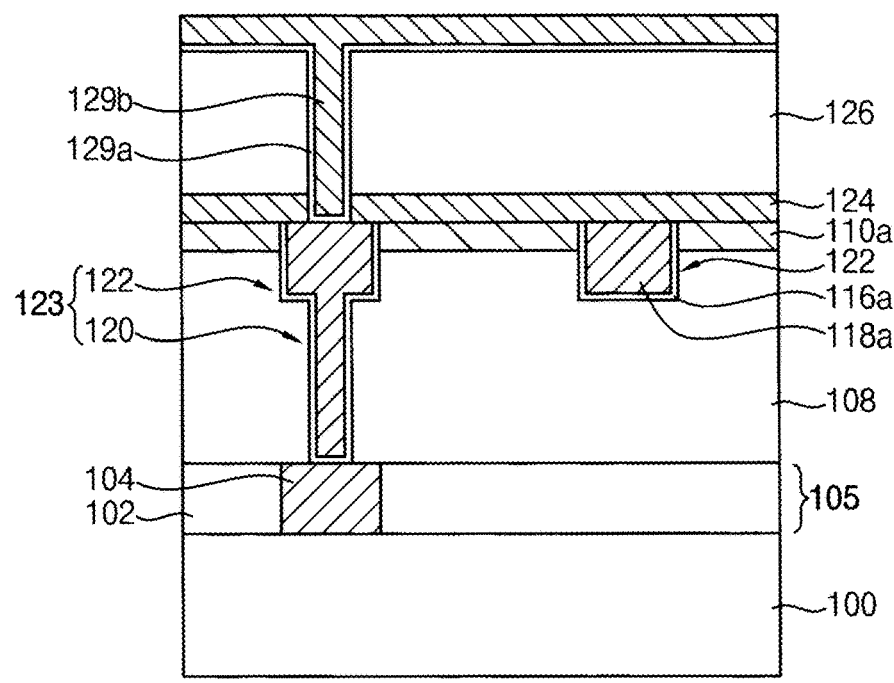

Referring to FIG. 9, a second barrier layer 129a may be formed on the second IMD layer 126 and a surface of the via hole 128. A second metal layer 129b may be formed on the second barrier layer 129a to fill the via hole 128. The second metal layer 129b may include a metal different from a metal of the metal pattern 118a.

The second barrier layer 129a and the second metal layer 129b may be formed by performing processes at a temperature higher than the temperature for forming the first wiring 123. For example, the second barrier layer 129a and the second metal layer 129b may be deposited at a temperature higher than 300° C. The second metal layer 129b may have a second resistance higher than the first resistance. For example, the second barrier layer 129a may include tungsten nitride, and the second metal layer 129b may include tungsten. The tungsten nitride and the tungsten may be formed by a CVD process, an atomic layer deposition (ALD) process, a physical vapor deposition (PVD) process, etc.

As the second barrier layer 129a and the second metal layer 129b are deposited at the temperature higher than 300° C., bonding of the materials of the first IMD layer 108 may be broken and the materials of the first IMD layer 108 may be outgassed during the depositing process. For example, outgassing of hydrogen from the first IMD layer 108 may occur.

When the outgassing is generated through the via hole 128, deposition source gases for forming the second barrier layer 129a and the second metal layer 129b may not sufficiently reach in the via hole 128. Thus, the second barrier layer 129a and the second metal layer 129b may not be normally formed.

However, the first and second blocking layers 110a and 124 are formed on the first IMD layer 108, and the first IMD layer 108 may not be exposed by the via hole 128. Thus, the first and second blocking layers 110a and 124 may reduce or prevent from outgassing of the materials (for example, hydrogen, water vapor (H2O), fluorine, chlorine, etc.) included in the first IMD layer 108 through the via hole 128. Thus, the second barrier layer 129a and the second metal layer 129b may be sufficiently fill the via hole 128 without void.

Figure 10:
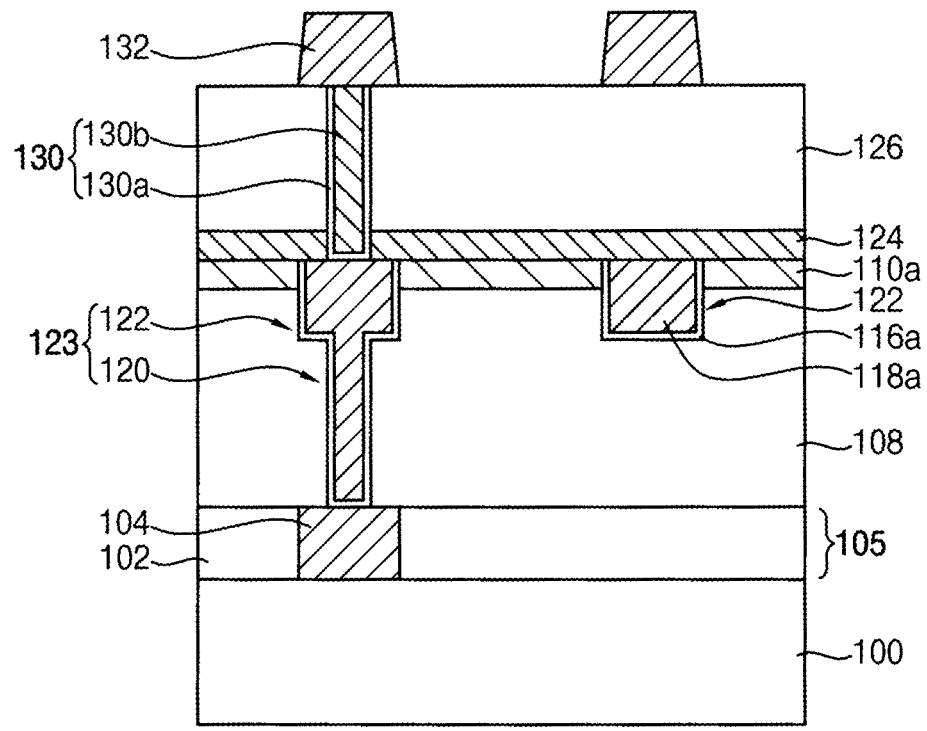

Referring to FIG. 10, the second metal layer 129b and the second barrier layer 129a are planarized until an upper surface of the second IMD layer 126 may be exposed to form a via contact 130 filling in the via hole 128. The via contact 130 may include the second barrier pattern 130a and the metal plug 130b. The planarization process may be formed by a CMP process and/or an etch back process.

A third metal layer may be formed on the via contact 130 and the second IMD layer 136, and the third metal layer may be patterned to form a second wiring 132. The third metal layer may include an aluminum layer. The second wiring 132 may be positioned at a top portion of the wiring structure of the BEOL.

An upper insulating interlayer (not shown) may be formed to cover the second wiring 132. The upper insulating interlayer may include silicon oxide. The upper insulating interlayer may include silicon oxide including hydrogen, and may serve as a layer for supplying hydrogen.

Figure 11:
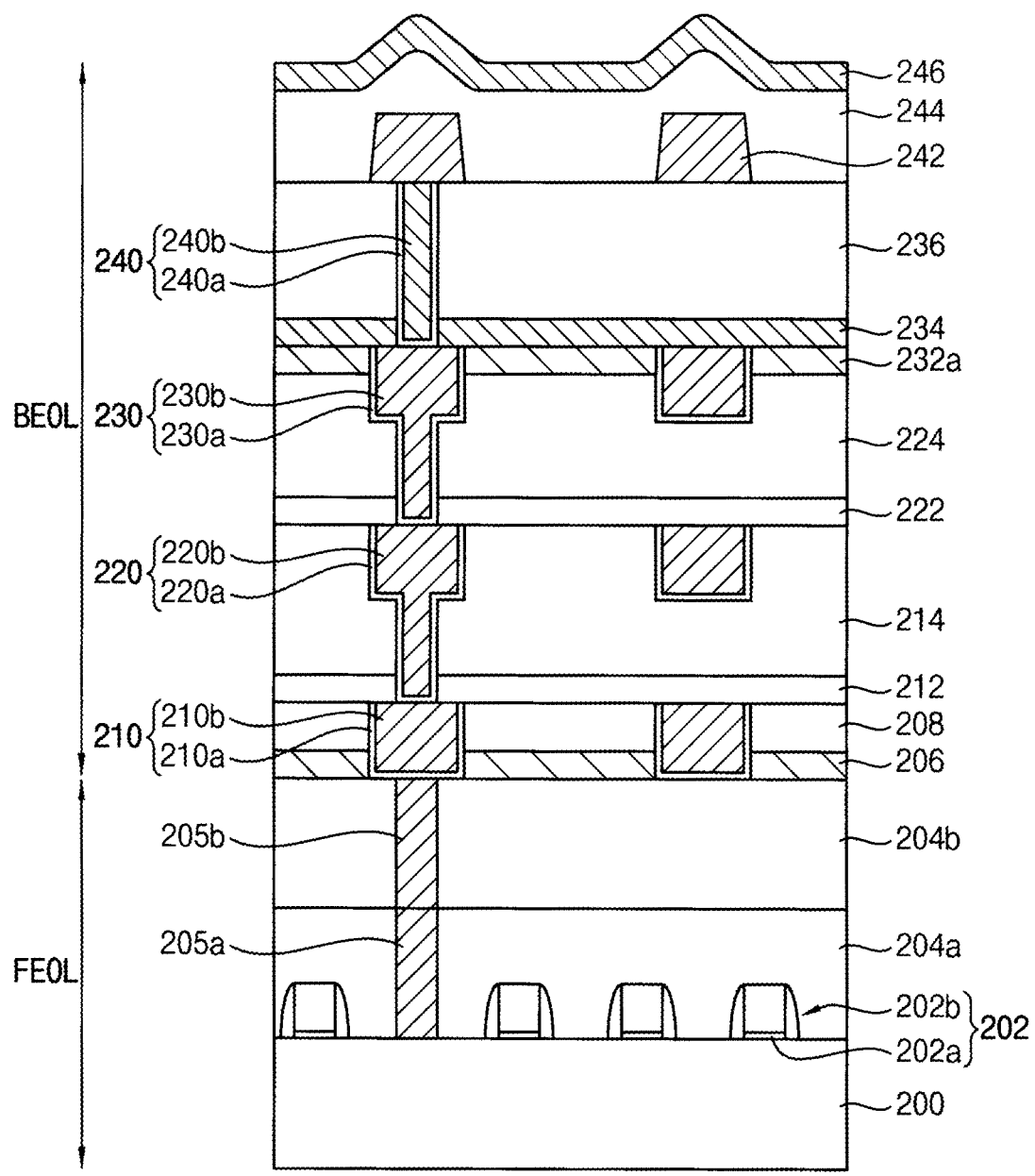

FIG. 11 is a cross-sectional view illustrating a semiconductor device in accordance with example embodiments.

In the semiconductor device shown in FIG. 11, a back end of line (BEOL) wiring structure includes multi-layered copper wirings.

Referring to FIG. 11, the semiconductor device may include lower structures 202, 204a, 204b, 205a and 205b formed on a substrate, and a first IMD layer 208, first metal wirings 210, a first etch stop layer 212, a second IMD layer 214, second metal wirings 220, a second etch stop layer 222, a third IMD layer 224, third metal wirings 230, a first blocking layer 232a, a second blocking layer 234, a fourth IMD layer 236, a via contact 240 and/or an upper wiring 242 formed on the lower structure. Further, a lower insulation layer 206 may be formed between the lower structure and the first IMD layer 208. An upper insulating interlayer 244 and a protect layer 246 may be further formed to cover the upper wiring 242.

The lower structure 202, 204a, 204b, 205a, and 205b may be formed on the substrate 200 by performing a front-end-of-line (FEOL) process for forming cells of the semiconductor memory device. In example embodiments, the lower structure may include memory cells and peripheral circuits constituting a DRAM device. For example, the lower structure may include a transistor 202, a capacitor, a resistor, lower wirings 205a and 205b, and/or lower insulating interlayers 204a and 204b, etc. In example embodiments, upper surfaces of the lower insulating interlayer 204b and the lower wiring 205b may be exposed at an uppermost surface of the lower structure. The lower insulating interlayer 204b may include silicon oxide having a dielectric constant of about 3.9 to about 4.5.

A wiring structure of a BEOL may be formed on the lower structure.

The lower insulation layer 206 may be formed on the lower structure. The lower insulation layer 206 may be formed on a lower sidewall of a lowermost wiring of the BEOL. The lower insulation layer 206 may include, e.g., silicon oxide, silicon nitride, or SiCN.

The first IMD layer 208 may be formed on the lower insulation layer 206. The first metal wiring 210 may be formed through the first IMD layer 208 and the lower insulation layer 206.

In example embodiments, the first IMD layer 208 may include a low-k material having a dielectric constant lower than a dielectric constant of silicon oxide (SiO2). In example embodiments, the first IMD layer 208 may include silicon oxide including carbon and hydrogen (SiCOH). In some example embodiments, the first IMD layer 208 may include, e.g., fluorine-doped silicon oxide (F—SiO2), porous silicon oxide, etc.

The first IMD layer 208 and the lower insulation layer 206 may include trenches. The first metal wiring 210 may be formed in the trenches. In example embodiments, each of the trenches may extend in one direction.

In example embodiments, the first metal wiring 210 may include a first barrier pattern 210a and a first metal pattern 210b. The first metal wiring 210 may contact the lower wiring 205b of the lower structure. The first barrier pattern 210a may include, e.g., titanium, titanium nitride, tantalum, and tantalum nitride, etc. The first metal pattern 210b may include copper.

The first etch stop layer 212 and the second IMD layer 214 may be formed on the first metal wiring 210 and the first IMD layer 208.

As the first etch stop layer 212 directly contacts the first IMD layer 208, the first etch stop layer 212 may include a material which may easily contact the first IMD layer 208. The first etch stop layer 212 may include a SiCN layer. However, as silicon nitride may have poor adhesion with the first IMD layer 208, the silicon nitride and the first IMD may not directly contact to each other. Thus, the silicon nitride may not be suitable for the material of the first etch stop layer 212.

The second IMD layer 214 may include a low-k material having a dielectric constant lower than a dielectric constant that of silicon oxide (SiO2). In example embodiments, the second IMD layer 214 may include a same material the same as a material of the first IMD layer 208.

The second metal wiring 220 may be formed through the second IMD layer 214 and the first etch stop layer 212. The second metal wiring 220 may be electrically connected to the first metal wiring 210.

The second metal wiring 220 may include a contact plug and a metal pattern. The contact plug may contact the first metal wiring 210, and the metal pattern may contact an upper surface of the contact plug. The second metal wiring 220 may include a second barrier pattern 220a and a second metal pattern 220b. The second barrier pattern 220a may include, e.g., titanium, titanium nitride, tantalum, and tantalum nitride, etc. The second metal pattern 220b may include copper.

In example embodiments, the second metal wiring 220 may have a structure substantially the same as a structure of the first wiring shown in FIG. 1. However, a lower sidewall of the second metal wiring 220 may contact the first etch stop layer 212. Also, the first blocking layer may not be formed on an upper sidewall the second metal wiring 220.

That is, the first etch stop layer 212 including SiCN may be formed at a portion between the first and second metal wirings 210 and 220. The second metal wiring 220 extending through the first etch stop layer 212 may include copper which may be formed by performing a process at a temperature lower than 300° C. Thus, outgas sing from the first and second IMD layers 208 and 214 may not occur, during forming the second metal wiring 220. Therefore, the first etch stop layer 212 may include a SiCN layer having a dielectric constant lower than a dielectric constant of silicon nitride.

The second etch stop layer 222 and the third IMD layer 224 may be formed on the second metal wiring 220 and the second IMD layer 214. A first blocking layer 232a may be formed on the third IMD layer 224.

In example embodiments, the second etch stop layer 222 may include SiCN.

The third IMD layer 224 may include a low-k material having a dielectric constant lower than a dielectric constant of silicon oxide (SiO2). The first blocking layer 232a may include silicon oxide having a dielectric constant of about 3.9 to about 4.5. The first blocking layer 232a may not include carbon. The first blocking layer 232a may be substantially the same as the first blocking layer illustrated with reference to FIG. 1.

The third metal wiring 230 may be formed through the first blocking layer 232a, the third IMD layer 224 and/or the second etch stop layer 222. The third metal wiring 230 may include a contact plug and a metal pattern. The third metal wiring 230 may include a third barrier layer 230a and a third metal pattern 230b. The third barrier layer 230a may include, e.g., titanium, titanium nitride, tantalum, and tantalum nitride, etc. The third metal pattern 230b may include copper. That is, the third metal wiring 230 may have a structure substantially the same as a structure of the second metal wiring 220. However, the first blocking layer 232a may be further formed on a sidewall of the third metal wiring 230.

In example embodiments, the third metal wiring 230 may be an uppermost wiring including copper, and the third IMD layer 224 may be an uppermost low-k dielectric layer of the wiring structure of the BEOL. That is, the first blocking layer 232a may be formed on an upper surface of the uppermost low-k dielectric layer of the wiring structure of the BEOL.

In the above description, the wiring structure of the BEOL includes the copper wiring stacked in three layers, however the number of the copper wiring wirings may not be limited thereto. For example, an etch stop layer, an IMD layer including a low-k material, and a metal wiring including copper may be further formed on the third metal wiring 230 and the third IMD layer 224. In example embodiments, the first blocking layer may not be formed on the third IMD layer, but may be formed on an uppermost low-k dielectric layer.

The second blocking layer 234 may cover upper surfaces of the third metal wiring 230 and the first blocking layer 232a. The second blocking layer 234 may include silicon nitride. The second blocking layer 234 may not include carbon. The second blocking layer 234 may be substantially the same as the second blocking layer illustrated with reference to FIG. 1.

In the semiconductor device, an upper sidewall of the third metal wiring 230 may be covered with the first blocking layer 232a, and an upper surface of the third metal wiring 230 may be covered with the second blocking layer 234. Outgassing from the third IMD layer 224 may be reduced or prevented by the first and second blocking layers 232a and 234.

The fourth IMD layer 236 may be formed on the second blocking layer 234. The fourth IMD layer 236 may have a dielectric constant higher than the dielectric constant of the third IMD layer 224 and lower than the dielectric constant of the second blocking layer 234. The fourth IMD layer 236 may have an etch resistance and a bond strength higher than those of the third IMD 224, respectively. The fourth IMD layer 236 may include an oxide having a dielectric constant higher than the dielectric constant of the third IMD layer 224. For example, the fourth IMD layer 236 may include silicon oxide having the dielectric constant of about 3.9 to about 4.5. In example embodiments, the fourth IMD layer 236 may include silicon oxide formed by using TEOS as a source. That is, the fourth IMD layer 236 may include a TEOS layer.

The via contact 240 may be a contact plug formed at the top portion of the wiring structure of the BEOL. The via contact 240 may contact an upper surface of the third metal wiring 230 extending through the fourth IMD layer 236 and the second blocking layer 234. The via contact 240 may be substantially the same as the via contact illustrated with reference to FIG. 1.

Thus, a fourth IMD layer 236 having the dielectric constant higher than dielectric constants of underlying low-k dielectric layers may be formed between the via contacts 240 formed at the top portion of wiring structure of the BEOL. Therefore, the semiconductor device may have higher reliability.

The upper wiring 242 may be formed on the via contact 240 and the fourth IMD layer 236. The upper wiring 242 may include a metal, and may be electrically connected with the via contact 240. The upper wiring 242 may be substantially the same as the second wiring illustrated with reference to FIG. 1.

An upper insulating interlayer 244 may cover the upper wiring 242. The upper insulating interlayer 244 may include silicon oxide. In example embodiments, the upper insulating interlayer 244 may include silicon oxide including hydrogen. For example, the upper insulating interlayer 244 may include silicon oxide formed by performing an HDP (high density plasma)-CVD process. That is, the upper insulating interlayer 244 may include a HDP oxide layer. The upper insulating interlayer 244 may serve as a layer for supplying hydrogen to a surface of the substrate 100.

A protect layer 246 may be formed on the upper insulating interlayer 244. The protect layer 246 may include silicon nitride.

When the hydrogen may be supplied on the surface of the substrate 100 through the first to third metal wirings and the upper wiring, the first and second blocking layers 232a and 234 may reduce or prevent hydrogen or water vapor from entering into the third IMD layer 224. Thus, damages of the third IMD layer due to the hydrogen or water vapor may decrease, so that the semiconductor device may have improved characteristics.

FIGS. 12 to 17 are cross-sectional views illustrating stages of a method of manufacturing a semiconductor device in accordance with example embodiments.

The semiconductor device may be the semiconductor device shown in FIG. 11. This method may include processes substantially the same as or similar to those illustrated with reference to FIGS. 2 to 10, and thus detailed descriptions thereon are omitted herein.

Figure 12:
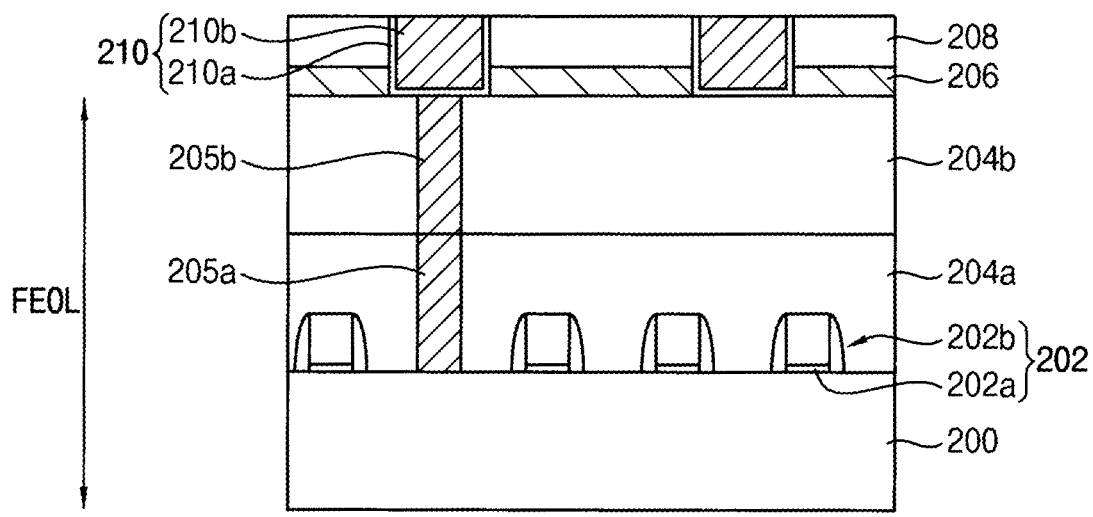

Referring to FIG. 12, a lower structure 202, 204a, 204b, 205a, and/or 205b may be formed on a substrate 100. The lower structure may include, e.g., a transistor, a capacitor, a resistor, a lower wiring, a lower insulating interlayer, etc. The lower structure 202, 204a, 204b, 205a, and/or 205b may be formed on the substrate 200 by performing a front-end-of-line (FEOL) process for forming cells of the semiconductor memory device.

A lower insulation layer 206 is formed on the lower structure. The lower insulation layer 206 may include, e.g., silicon oxide, silicon nitride, or SiCN. A first IMD layer 208 may be formed on the lower insulation layer 206. The first IMD layer 208 may be formed of a low-k material having a dielectric constant lower than a dielectric constant of silicon oxide (SiO2).

Portions of the first IMD layer 208 and the lower insulation layer 206 may be etched to form a first trench. The lower wiring 205b included in the lower structure may be exposed by a bottom of the first trench.

A first metal wiring 210 may be formed in the first trench. For example, a first barrier layer may be conformally formed on surfaces of the first trench and the first IMD layer 208, and a first metal layer may be formed on the first barrier layer to fill the first trench. The first barrier layer and the first metal layer may be planarized until an upper surface of the first IMD layer 208 may be exposed to form the first metal wiring 210. Thus, the first metal wiring may include a first barrier pattern 210a and a first metal pattern 210b.

Figure 13:
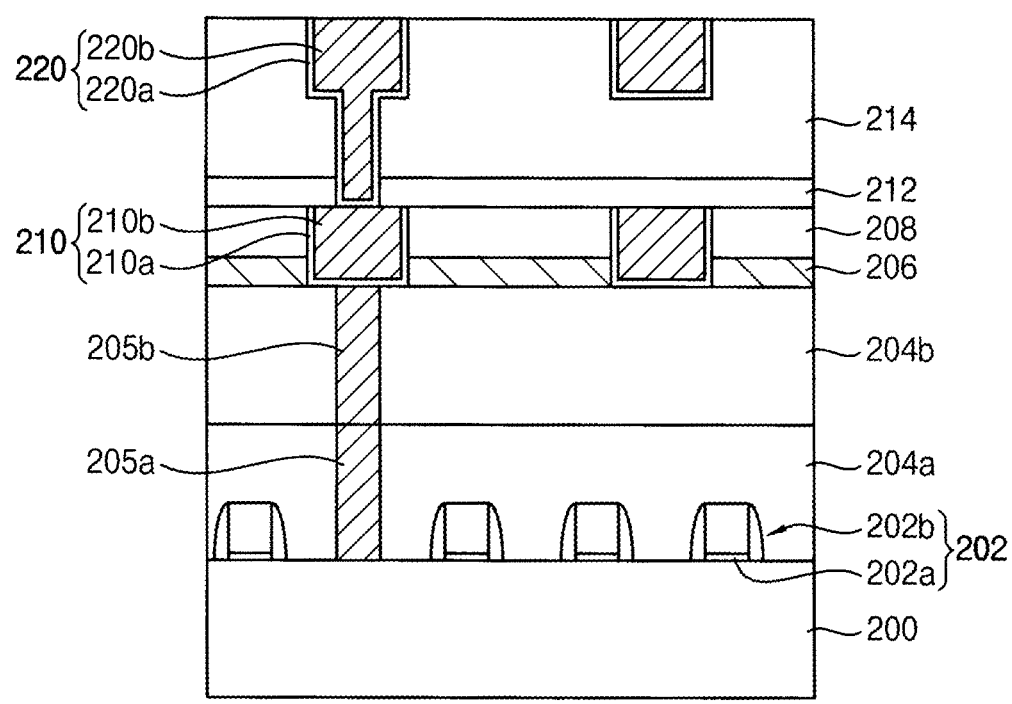

Referring to FIG. 13, a first etch stop layer 212 and a second IMD layer 214 may be formed on the first metal wiring 210 and a first IMD layer 208.

In example embodiments, the first etch stop layer 212 may include SiCN. The first etch stop layer 212 may be formed by a CVD process or an ALD process. The second IMD layer 214 may include a low-k material having a dielectric constant lower than a dielectric constant of silicon oxide.

The second metal wiring 220 may be formed to electrically connect with the first metal wiring 210 through the second IMD layer 214 and the first etch stop layer 212.

For example, a portion of the second IMD layer 214 may be etched to form a second contact hole and a second trench. The second metal wiring 220 may be formed to fill the second contact hole and the second trench. The second metal wiring 220 may include a second barrier pattern 220a and a second metal pattern 220b. The process of forming the second metal wiring 220 may be substantially the same as forming the first wiring illustrated with reference to FIGS. 3 to 5. However, the first blocking layer may not be formed on the second IMD layer 214.

Figure 14:
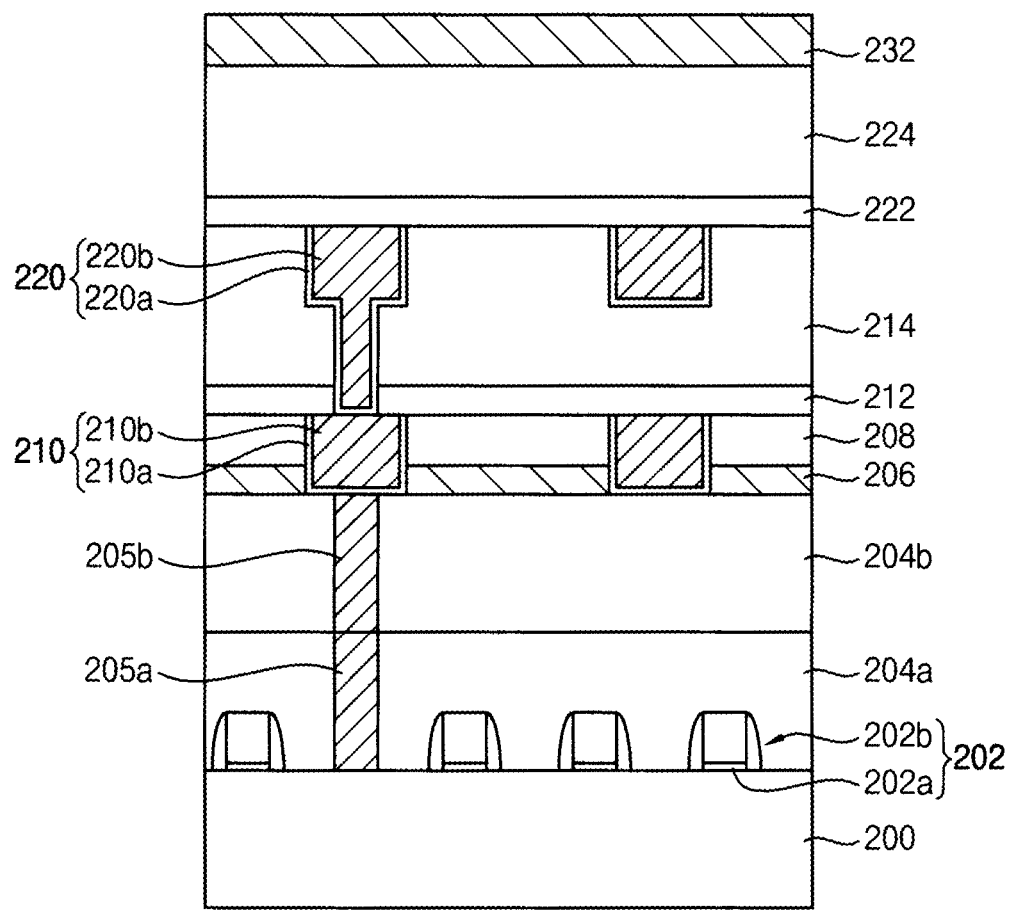

Referring to FIG. 14, a second etch stop layer 222, a third IMD layer 224 and/or a first preliminary blocking layer 232 may be formed on the second metal wiring 220 and the second IMD layer 214. In example embodiments, the second etch stop layer 222 may include SiCN. The third IMD layer 224 may include a low-k material having a dielectric constant lower than the dielectric constant of silicon oxide. The preliminary first blocking layer 232 may be formed of silicon oxide having a dielectric constant higher than the dielectric constant of the third IMD layer 224. The process of forming the third IMD layer 224 may be substantially the same as the process of forming the first IMD layer illustrated with reference to FIG. 2. The process of forming the preliminary first blocking layer 232 may be substantially the same as forming the preliminary first blocking layer illustrated with reference to FIG. 2.

Figure 15:
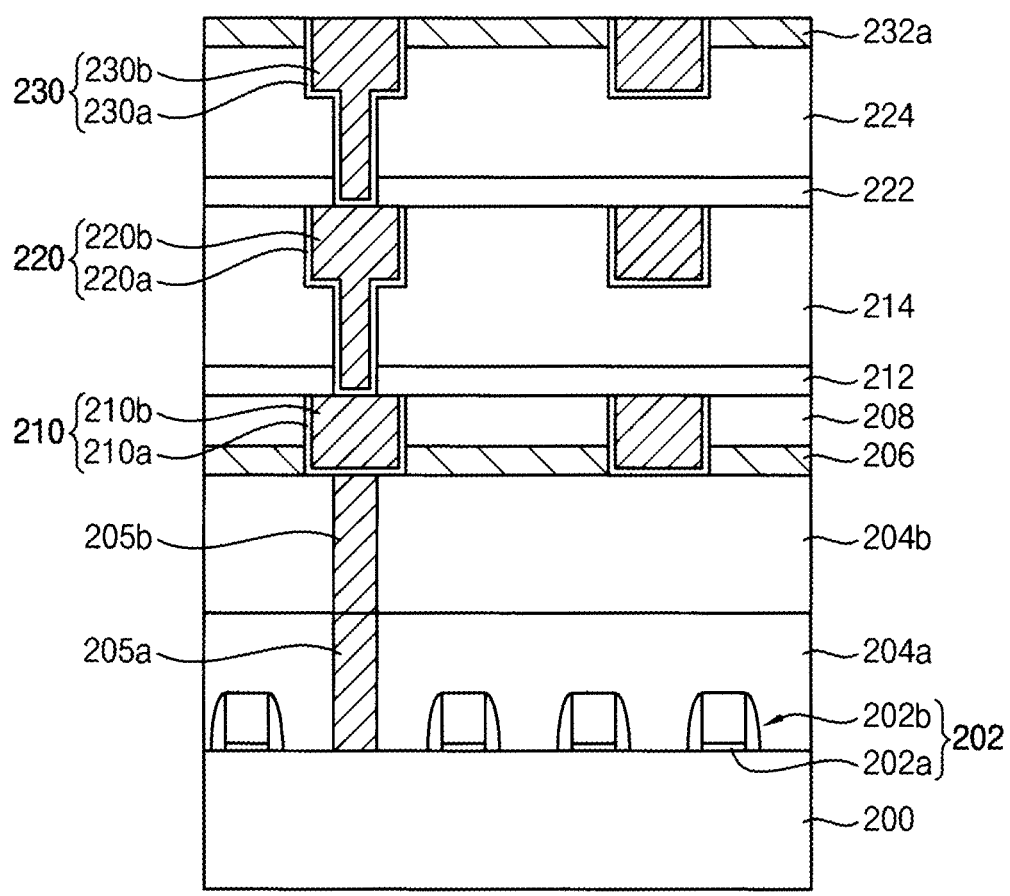

Referring to FIG. 15, a third metal wiring 230 may be formed through the preliminary first blocking layer 232, the third IMD layer 224 and the second etch stop layer 222. The third metal wiring 230 may include a third barrier pattern 230a and a third metal pattern 230b. The process of forming the third metal wiring 230 may be the same as forming the first wiring illustrated with reference to FIGS. 3 to 5. When the process of forming the third metal wiring 230 is performed, the thickness of the preliminary first blocking layer 232 may be reduced to form the first blocking layer 232a.

Figure 16:
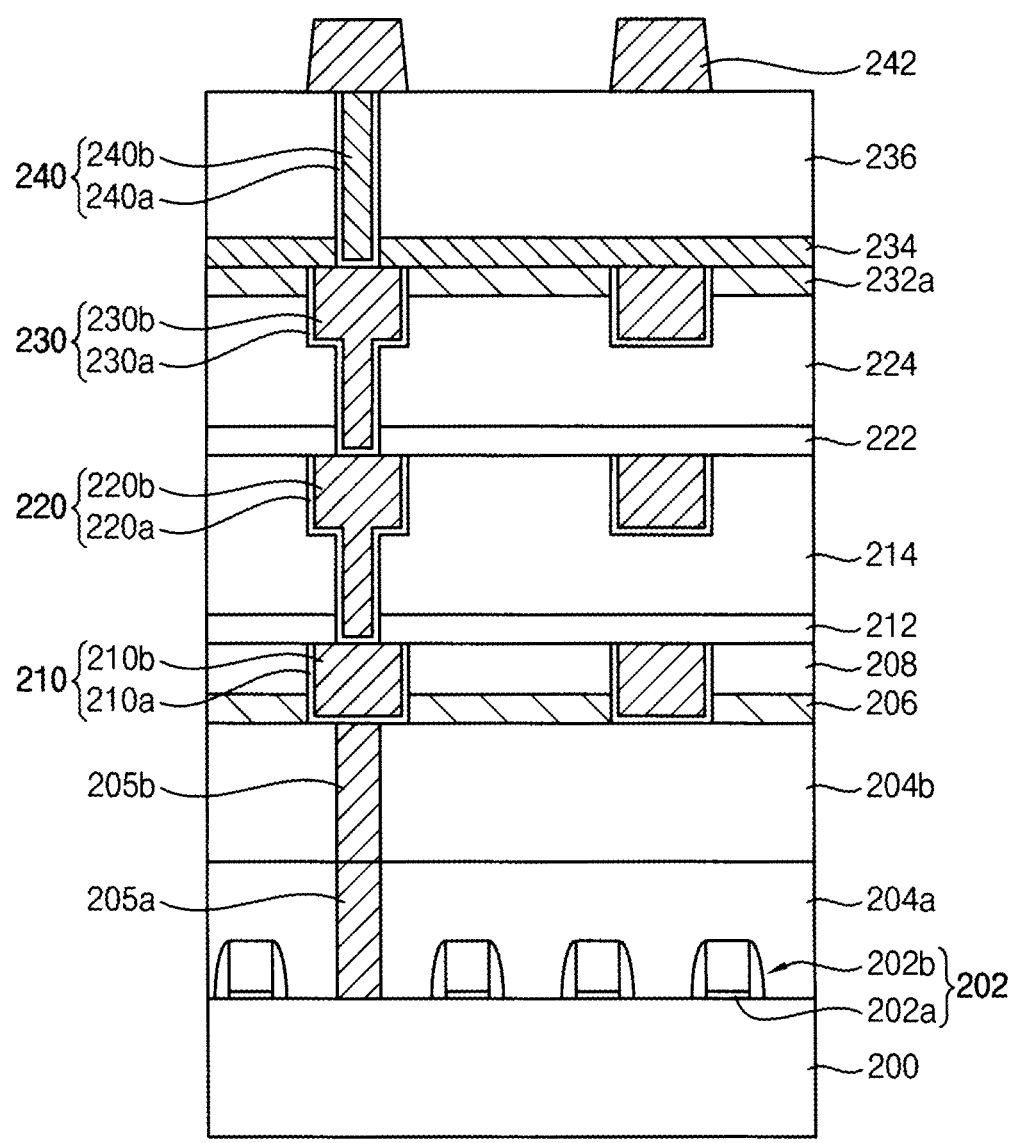

Referring to FIG. 16, a second blocking layer 234 may be formed on the first blocking layer 232a and the third metal wiring 230. A fourth IMD layer 236 may be formed on the second blocking layer 234. The second blocking layer 234 may include silicon nitride. The fourth IMD layer 236 may be formed of silicon oxide having a dielectric constant higher than the dielectric constant of the third IMD layer 224.

A via contact 240 may be formed to electrically connect with the third metal wiring 230 through the fourth IMD layer 236 and the second blocking layer 234. The via contact 240 may include a fourth barrier pattern 240a and a fourth metal pattern 240b. An upper wiring 242 is formed on the via contact 240 and the fourth IMD layer 236.

The processes of forming the second blocking layer 234, the fourth IMD layer 236, the via contact 240, and the upper wiring 242 may be substantially the same as those illustrated with reference to FIGS. 6 to 10.

Figure 17:
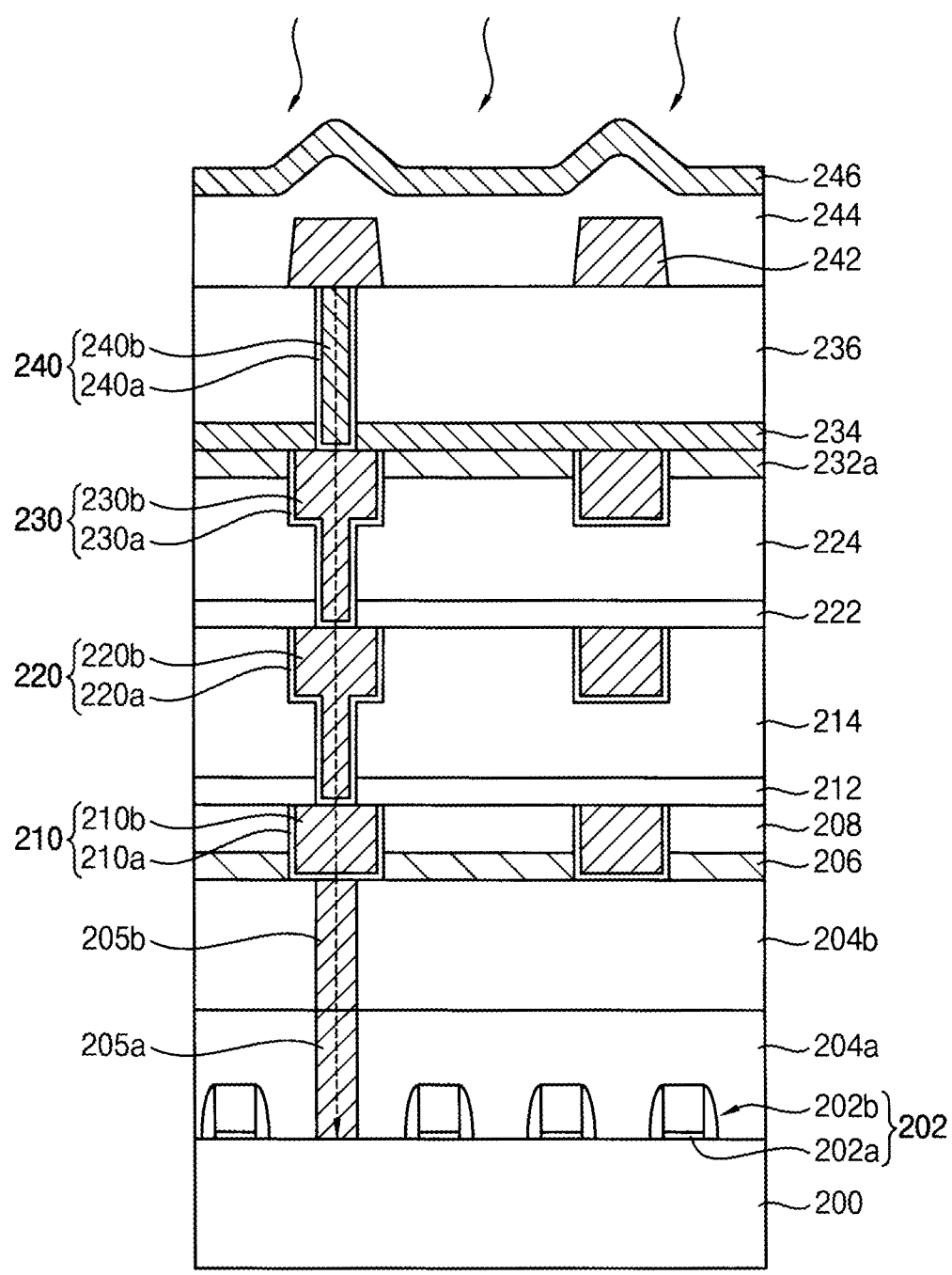

Referring to FIG. 17, an upper insulating interlayer 244 may be formed to cover the upper wiring 242. In example embodiments, the upper insulating interlayer 244 may include silicon oxide containing hydrogen. The upper insulating interlayer 244 may be a silicon oxide layer formed by a HDP-CVD process. That is, the upper insulating interlayer 244 may include a HDP oxide.

A protect layer 246 may be formed on the upper insulating interlayer 244. The protect layer 246 may include silicon nitride.

An anneal process may be performed on the substrate 200 after forming the protect layer. The hydrogen contained in the upper insulating interlayer 244 may be introduced into a surface of the substrate 200 through the first to third metal wirings 210, 220, and 230 and the upper wiring 242. The hydrogen introduced into the surface of the substrate 200 may remove trap sites or dangling bonds included in the surface of the substrate 100 or a gate insulating layer. Thus, the transistors 202 formed on the substrate 200 may have good electrical characteristics.

However, when the anneal process is performed, hydrogen or water vapor may be easily entered into the third IMD layer 224 including the low-k material. For example, the third IMD layer 224 may be easily damaged by plasma in the process of forming the upper insulating interlayer. Thus, the third IMD layer 224 can be easily absorbed. However, the first and second blocking layers 232a and 234 may effectively reduce or prevent hydrogen or water vapor from entering into the third IMD layer 224. Thus, defects due to the entering of hydrogen or water vapor into the third IMD layer 224 may be reduced.

Figure 18:
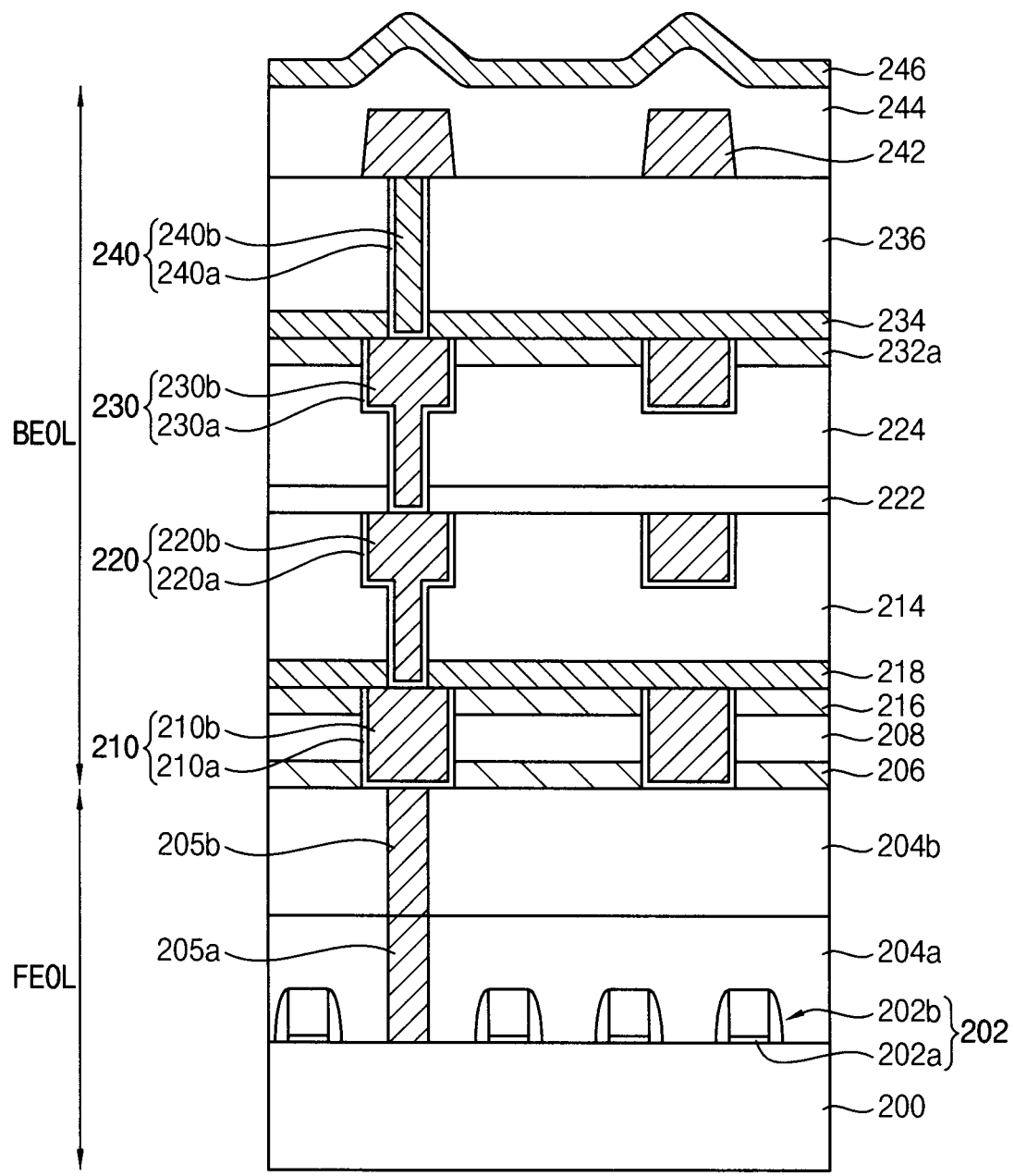

FIG. 18 is a cross-sectional view illustrating a semiconductor device in accordance with example embodiments.

In a wiring structure of the BEOL of the semiconductor device shown in FIG. 18, lower blocking layers may be formed on at least one of low-k dielectric layer under an uppermost low-k dielectric layer as well as the uppermost low-k dielectric layer. Each of the lower blocking layers may have a structure substantially the same as structures of the first and second blocking layers. As the lower blocking layer may serve as an etch stop layer, an additional etch stop layer may not be formed. The semiconductor device may be substantially the same as the semiconductor device illustrated with reference to FIG. 11, except for the blocking layers.

Referring to FIG. 18, the semiconductor device includes a lower structure formed on a substrate 100, and a first IMD layer 208, first metal wirings 210, a first lower blocking layer 216, a second lower blocking layer 218, a second IMD layer 214, second metal wirings 220, a first etch stop layer 222, a third IMD layer 224, third metal wirings 230, a first blocking layer 232a, a second blocking layer 234, a fourth IMD layer 236, a via contact 240 and/or an upper wiring 242 formed on the lower structure. Also, the lower insulation layer 206 may be formed on the lower structure. An upper insulating interlayer 244 and a protect layer 246 may be formed to cover the upper wiring 242.

The first and second lower blocking layers 216 and 218 may be formed on at least one of the copper wirings below the uppermost copper wirings.

In example embodiments, the first lower blocking layer 216 may be formed on the first IMD layer 208. The first lower blocking layer 216 may be formed on an upper sidewall of the first metal wirings 210. The first lower blocking layer 216 may include a material the same as a material of the first blocking layer illustrated with reference to FIG. 1. The first lower blocking layer 216 may include silicon oxide having a dielectric constant of about 3.9 to about 4.5.

The first metal wiring 210 may contact a portion of the lower structure through the first lower blocking layer 216, the first IMD layer 209 and the lower insulation layer 206.

In example embodiments, the second lower blocking layer 218 may be formed on the first metal wiring 210 and the first lower blocking layer 216. The second lower blocking layer 218 may include a material same as a material of the second blocking layer illustrated with reference to FIG. 1. The second lower blocking layer 218 may be formed of silicon nitride having a dielectric constant higher than a dielectric constant of the first lower blocking layer 216.

As shown in FIG. 18, the first and second lower blocking layers 216 and 218 may be formed on the first metal wirings 210. However, in some example embodiments, the first and second lower blocking layers 216 and 218 may be formed on the second metal wirings 220.

The first and second blocking layers 232a and 234 may be formed on the uppermost low-k dielectric layer. That is, the first and second blocking layers 232a and 234 may be formed on the uppermost copper wiring. The first and second blocking layers 232a and 234 may be substantially the same as the first and second blocking layers illustrated with reference to FIGS. 1 and 11, respectively.

Figure 19:
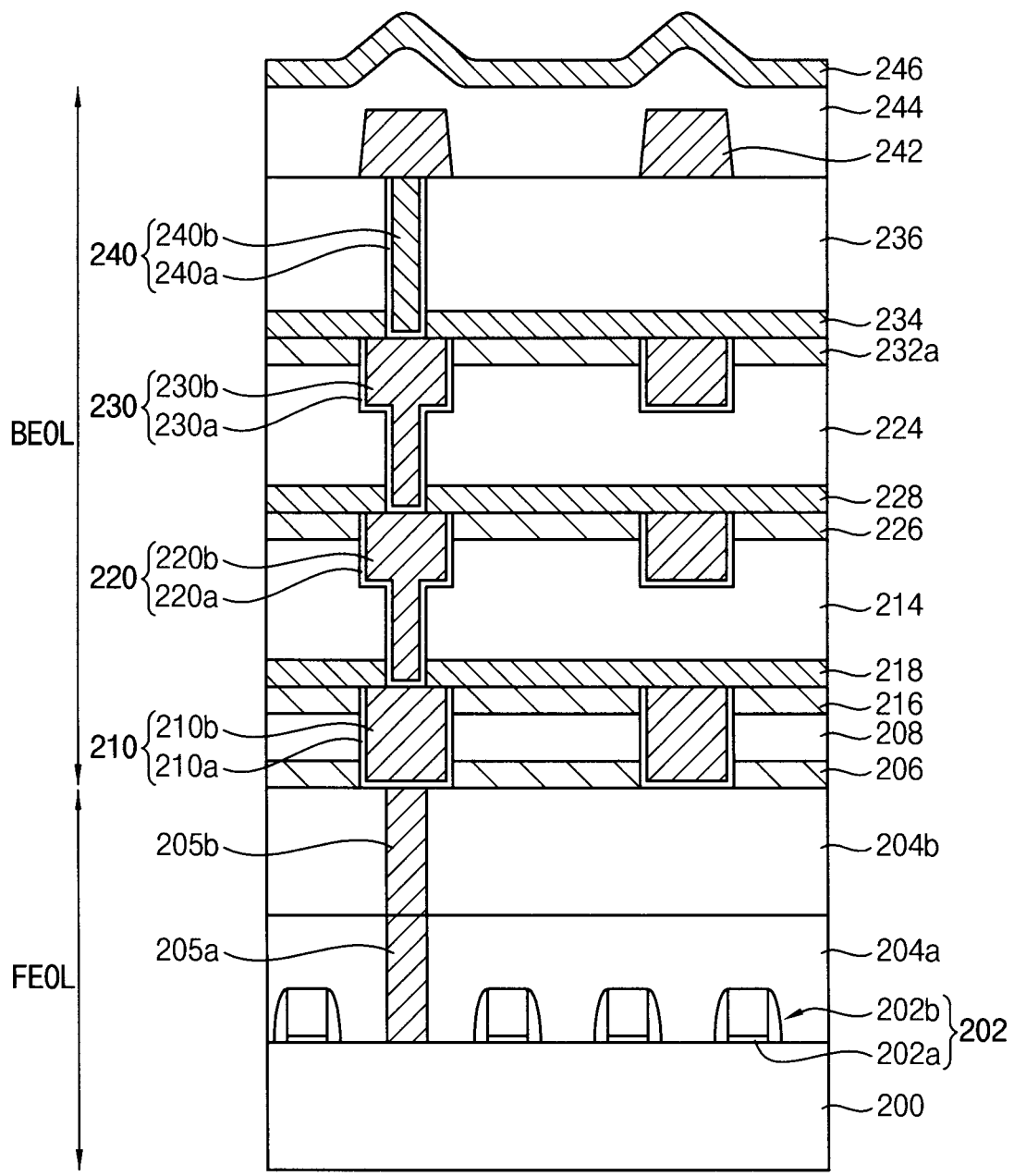

FIG. 19 is a cross-sectional view illustrating a semiconductor device in accordance with example embodiments.

In a wiring structure of the BEOL of the semiconductor device shown in FIG. 19, lower blocking layers may be formed on all of low-k dielectric layers, respectively. Each of the lower blocking layers may have a structure substantially the same as structures of the first and second blocking layers. That is, blocking structures including the first and second blocking layers may be formed on all of the copper wirings, respectively. The lower blocking layers may serve as etch stop layers, an additional etch stop layer may not be formed. The semiconductor device may be substantially the same as the semiconductor device illustrated with reference to FIG. 11, except for the blocking layers.

Referring to FIG. 19, the semiconductor device includes a lower structure formed on a substrate 100, and a first IMD layer 208, first metal wirings 210, a first lower blocking layer 216, a second lower blocking layer 218, a second IMD layer 214, second metal wirings 220, a third lower blocking layer 226, a fourth lower blocking layer 228, a third IMD layer 224, third metal wirings 230, a first blocking layer 232a, a second blocking layer 234, a fourth IMD layer 236, a via contact 240 and/or an upper wiring 242 formed on the lower structure. Also, a lower insulation layer 206 may be further formed on the lower structure. An upper insulating interlayer 244 and a protect layer 246 may be formed to cover the upper wiring 242.

In example embodiments, the first and third lower blocking layers 216 and 226 and the first blocking layer may include materials the same as a material of the first blocking layer illustrated with reference to FIG. 1.

In example embodiments, the second and fourth lower blocking layers 218 and 228 and the second blocking layer may include materials the same as a material of the first blocking layer illustrated with reference to FIG. 1.

Figure 20:
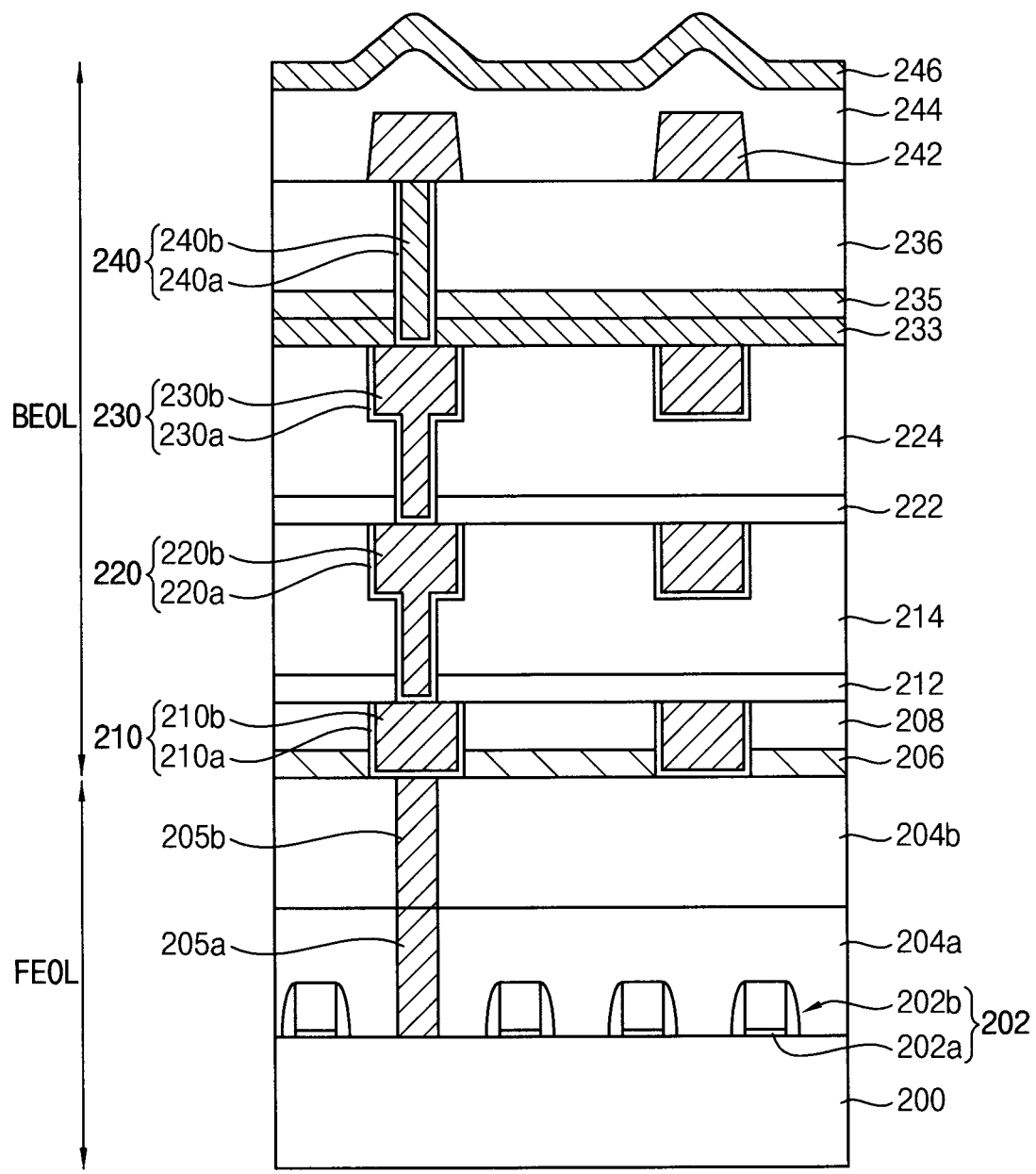

FIG. 20 is a cross-sectional view illustrating a semiconductor device in accordance with example embodiments.

The semiconductor device may be substantially the same as the semiconductor device illustrated with reference to FIG. 11, except for positions of the first and second blocking layers.

Referring to FIG. 20, the semiconductor device includes lower structures formed on a substrate 200, and a first IMD layer 208, first metal wirings 210, a first etch stop layer 212, a second IMD layer 214, second metal wirings 220, a third IMD layer 224, third metal wirings 230, a first blocking layer 233, a second blocking layer 235, a fourth IMD layer 236, a via contact 240, and/or an upper wiring 242. Also, a lower insulation layer 206 may be formed between the lower structure and the first IMD layer 208. An upper insulating interlayer 244 and a protect layer 246 may be formed to cover the upper wiring 242.

In example embodiments, the first blocking layer 233 may be formed to cover the upper surfaces of the third IMD layer 224 and the third metal wiring 230. The second blocking layer 235 may be formed on the first blocking layer 233. That is, the first blocking layer 233 may not be formed on an upper sidewall of the third metal wiring 230.

In example embodiments, the first blocking layer 233 may include a material the same as a material of the first blocking layer illustrated with reference to FIG. 1. In example embodiments, the second blocking layer 235 may include a material the same as a material of the second blocking layer illustrated with reference to FIG. 1. Thus, at least two blocking layers may be formed on an uppermost low-k dielectric layer, that is third IMD layer 224.

Figure 21:
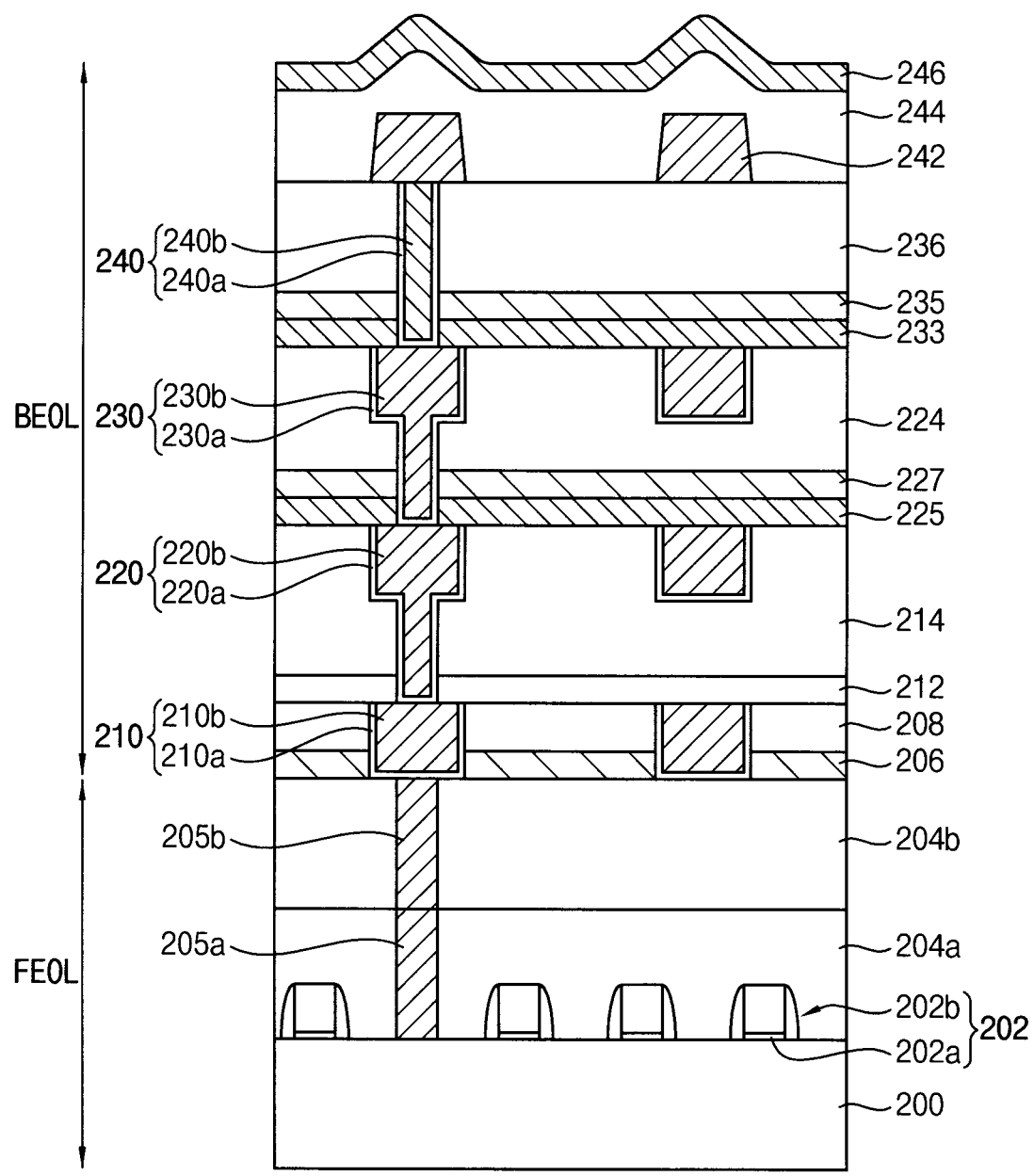

FIG. 21 is a cross-sectional view illustrating a semiconductor device in accordance with example embodiments.

The semiconductor device may be substantially the same as the semiconductor device illustrated with reference to FIG. 20, except for a first lower blocking layer and a second lower blocking layer.

In a wiring structure of the BEOL of the semiconductor device shown in FIG. 21, lower blocking layers may be formed on at least one of low-k dielectric layer under an uppermost low-k dielectric layer as well as the uppermost low-k dielectric layer. As the lower blocking layers may serve as etch stop layers, an additional etch stop layer may not be formed.

Referring to FIG. 21, the semiconductor device may include lower structures formed on a substrate 100, and a first IMD layer 208, first metal wirings 210, a first etch stop layer 212, a second IMD layer 214, second metal wirings 220, a first lower blocking layer 225, a second lower blocking layer 227, a third IMD layer 224, a third metal wiring 230, a first blocking layer 233, a second blocking layer 235, a fourth IMD layer 236, a via contact 240 and/or an upper wiring 242. Also, a lower insulation layer 206 may be further formed on the lower structure. An upper insulating interlayer 244 and a protect layer 246 may be formed to cover the upper wiring 242.

The first lower blocking layer 225 and second lower blocking layer 227 may be formed on at least one of copper wirings below an uppermost copper wiring.

In example embodiments, the first lower blocking layer 225 may be formed to cover an upper surface of the second IMD layer 214 and the second metal wiring 220. The second lower blocking layer 227 may be formed on the first lower blocking layer 225.

In example embodiments, the first lower blocking layer 225 may include a material the same as a material of the first blocking layer illustrated with reference to FIG. 1. In example embodiments, the second lower blocking layer 227 may include a material the same as a material of the second blocking layer illustrated with reference to FIG. 1.

As shown in FIG. 21, the first and second lower blocking layers 225 and 227 may be formed on the second metal wirings 220. However, in some example embodiments, the first and second lower blocking layers 225 and 227 may be formed on the first metal wirings 210.

The semiconductor device may be a volatile memory device such as a DRAM device, a SRAM device or a nonvolatile memory device such as a flash memory device, a PRAM device, a MRAM device, an RRAM device, or the like. The wiring structure may be applied to wiring structures formed on a peripheral circuit region or a cell region of the memory device.

Although a few example embodiments have been described, those skilled in the art will readily appreciate that many modifications are possible in the example embodiments without materially departing from the novel teachings and advantages of the present inventive concepts. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
   a substrate;
   a first insulating layer disposed above the substrate and including at least one of carbon or hydrogen;
   a first metal wiring disposed in the first insulating layer and including a contact plug and a conductive line that is disposed on the contact plug, the first metal wiring including copper;
   a second insulating layer disposed on the first insulating layer;
   a via contact disposed in the second insulating layer and contacting the first metal wiring;
   a first blocking layer disposed between the first insulating layer and the second insulating layer, and including an oxide which has no carbon;
   a second blocking layer disposed between the first blocking layer and the second insulating layer, and including a nitride which has no carbon;
   a second metal wiring disposed on the second insulating layer and contacting the via contact, the second metal wiring including aluminum; and
   a third insulating layer disposed on the second metal wiring and the second insulating layer,
   wherein the third insulating layer contacts a top surface and a side surface of the second metal wiring, and
   each of the first blocking layer and the second blocking layer has a dielectric constant higher than a dielectric constant of the first insulating layer.

2. The semiconductor device of claim 1, wherein the third insulating layer includes an oxide which has hydrogen.

3. The semiconductor device of claim 1, further comprising:
   an etch stop layer that is disposed between the substrate and the first insulating layer,
   wherein the contact plug of the first metal wiring passes through the etch stop layer and is electrically connected to the substrate.

4. The semiconductor device of claim 3, wherein the etch stop layer includes carbon.

5. The semiconductor device of claim 1, wherein the conductive line of the first metal wiring contacts the first blocking layer, the second blocking layer and the via contact, and the first blocking layer is spaced apart from the via contact.

6. The semiconductor device of claim 1, wherein a top surface of the conductive line of the first metal wiring is substantially coplanar with a top surface of the first blocking layer.

7. The semiconductor device of claim 1, wherein the second blocking layer contacts a top surface of the conductive line of the first metal wiring.

8. The semiconductor device of claim 1, wherein the via contact is in contact with the conductive line of the first metal wiring, the first blocking layer and the second blocking layer, and
   the conductive line of the first metal wiring is spaced apart from the second blocking layer.

9. The semiconductor device of claim 1, wherein the first blocking layer contacts a top surface of the conductive line of the first metal wiring.

10. The semiconductor device of claim 1, wherein a top surface of the conductive line of the first metal wiring is substantially coplanar with a top surface of the first insulating layer.

11. The semiconductor device of claim 1, further comprising a fourth insulating layer that is disposed on the third insulating layer, and
    the fourth insulating layer includes a nitride.

12. The semiconductor device of claim 1, wherein the dielectric constant of the second blocking layer is higher than the dielectric constant of the first blocking layer.

13. The semiconductor device of claim 1, wherein a dielectric constant of the second insulating layer is higher than the dielectric constant of the first insulating layer and is lower than the dielectric constant of the second blocking layer.

14. The semiconductor device of claim 1, wherein the via contact includes tungsten.

15. The semiconductor device of claim 1, wherein the first metal wiring passes through the first insulating layer and the first blocking layer, and
    the via contact passes through the second blocking layer and the second insulating layer.

16. The semiconductor device of claim 1, wherein the first metal wiring passes through the first metal wiring, and
    the via contact passes through the first blocking layer, the second blocking layer and the second insulating layer.

17. A semiconductor device comprising:
    a substrate;
    a first insulating layer disposed above the substrate and including at least one of carbon or hydrogen;

a first blocking layer disposed on the first insulating layer and including silicon oxide which has no carbon;
a second blocking layer disposed on the first blocking layer and including silicon nitride which has no carbon;
a first metal wiring disposed in the first insulating layer and the first blocking layer, and including a contact plug and a conductive line that is disposed on the contact plug;
a second insulating layer disposed on the second blocking layer;
a via contact disposed in the second blocking layer and the second insulating layer and contacting the first metal wiring;
a second metal wiring disposed on the second insulating layer and contacting the via contact;
a third insulating layer disposed on the second metal wiring and the second insulating layer; and
a fourth insulating layer disposed on the third insulating layer and including a nitride,
wherein the conductive line of the first metal wiring contacts the first blocking layer, second blocking layer and the via contact,
the first blocking layer is spaced apart from the via contact,
a top surface of the conductive line of the first metal wiring is substantially coplanar with a top surface of the first blocking layer, and
the third insulating layer contacts a top surface and a side surface of the second metal wiring.

18. The semiconductor device of claim 17, wherein the second blocking layer contacts a top surface of the conductive line of the first metal wiring.

19. A semiconductor device comprising:
a substrate;
a first insulating layer disposed above the substrate and including at least one of carbon or hydrogen;
a first blocking layer disposed on the first insulating layer and including silicon oxide having no carbon;
a second blocking layer disposed on the first blocking layer and including silicon nitride having no carbon;
a first metal wiring disposed in the first insulating layer, and including a contact plug and a conductive line that is disposed on the contact plug;
a second insulating layer disposed on the second blocking layer;
a via contact disposed in the first blocking layer, the second blocking layer and the second insulating layer and contacting the first metal wiring;
a second metal wiring disposed on the second insulating layer and contacting the via contact;
a third insulating layer disposed on the second metal wiring and the second insulating layer; and
a fourth insulating layer disposed on the third insulating layer and including a nitride,
wherein the via contact is in contact with the conductive line of the first metal wiring, the first blocking layer and the second blocking layer,
the conductive line of the first metal wiring is spaced apart from the second blocking layer,
a top surface of the conductive line of the first metal wiring is substantially coplanar with a top surface of the first insulating layer, and
the third insulating layer contacts a top surface and a side surface of the second metal wiring.

20. The semiconductor device of claim 19, wherein the first blocking layer contacts a top surface of the conductive line of the first metal wiring.

* * * * *